(12) United States Patent
Kim et al.

(10) Patent No.: US 8,369,173 B2
(45) Date of Patent: Feb. 5, 2013

(54) SEMICONDUCTOR DEVICES AND METHODS FOR CHANGING OPERATING CHARACTERISTICS AND SEMICONDUCTOR SYSTEMS INCLUDING THE SAME

(75) Inventors: Ho Jung Kim, Suwon-si (KR); Chul Woo Park, Yongin-si (KR); Sang Beom Kang, Hwasung-si (KR); Hyun Ho Choi, Suwon-si (KR); Jung Min Lee, Suwon-si (KR); Seung Eon Ahn, Hwasung-si (KR)

(73) Assignee: Samsung Electronics Co., Ltd. (KR)

( * ) Notice: Subject to any disclaimer, the term of this patent is extended or adjusted under 35 U.S.C. 154(b) by 276 days.

(21) Appl. No.: 12/706,756

(22) Filed: Feb. 17, 2010

(65) Prior Publication Data

US 2010/0214862 A1 Aug. 26, 2010

(30) Foreign Application Priority Data

Feb. 26, 2009 (KR) ........................ 10-2009-0016341

(51) Int. Cl.
*G11C 7/00* (2006.01)
(52) U.S. Cl. ...................... 365/226; 365/225.7; 365/194

(58) Field of Classification Search ............... 365/226, 365/210, 189.01, 225.7, 194
See application file for complete search history.

(56) References Cited

U.S. PATENT DOCUMENTS

| | | | |
|---|---|---|---|
| 5,673,398 A * | 9/1997 | Takeda | 710/105 |
| 6,035,432 A | 3/2000 | Jeddeloh | |
| 6,995,999 B2 * | 2/2006 | Morimoto | 365/148 |
| 7,286,431 B2 * | 10/2007 | Hidaka | 365/189.14 |
| 2002/0065574 A1 | 5/2002 | Nakada | |
| 2002/0095562 A1 | 7/2002 | Nakanishi et al. | |
| 2004/0114429 A1 * | 6/2004 | Ehiro et al. | 365/158 |
| 2004/0120204 A1 * | 6/2004 | Kanda et al. | 365/225.7 |
| 2004/0153603 A1 * | 8/2004 | Janzen | 711/106 |
| 2006/0268596 A1 * | 11/2006 | Yamaoka et al. | 365/145 |
| 2007/0055687 A1 | 3/2007 | Josten et al. | |

* cited by examiner

*Primary Examiner* — Connie Yoha
(74) *Attorney, Agent, or Firm* — Myers Bigel Sibley & Sajovec

(57) ABSTRACT

A method of changing a parameter in a semiconductor device is provided. The method includes receiving and storing data in a storage region; and changing at least one between a DC characteristic and an AC timing characteristic of a parameter, used to access a non-volatile memory cell included in a memory core of the semiconductor device, according to the data stored in the storage.

16 Claims, 16 Drawing Sheets

SEMICONDUCTOR DEVICES AND METHODS FOR CHANGING OPERATING CHARACTERISTICS AND SEMICONDUCTOR SYSTEMS INCLUDING THE SAME

CROSS-REFERENCE TO RELATED APPLICATIONS

This application claims priority under 35 U.S.C. §119 to Korean Patent Application No. 10-2009-0016341, filed on 26 Feb., 2009, in the Korean Intellectual Property Office, the disclosure of which is hereby incorporated herein by reference as if set forth fully herein.

BACKGROUND

The present invention relates to a semiconductor device, and more particularly, to a semiconductor device and method for changing at least one characteristic thereof and a semiconductor system including the semiconductor device.

For non-volatile memory devices, there exist specifications on endurance (e.g., the number of times that erase and program operations can be performed) and retention (e.g., a period of time while data can be retained). Accordingly, when the quantities of the erase operations and/or program operations increase, fail data may occur in non-volatile memory devices. When the fail data cannot be recovered, data reliability may decrease.

SUMMARY

Some embodiments of the present invention provide semiconductor devices and methods for changing a parameter, which may affect at least one of endurance and retention, during operation and a semiconductor system including the semiconductor device.

Some embodiments of such methods include receiving and storing data in a storage region and changing at least one of a DC characteristic and an AC timing characteristic of a parameter, used to access a non-volatile memory cell included in a memory core of the semiconductor device, according to the data stored in the storage region. In some embodiments, the parameter is a program time, an erase time, a read time, a program voltage, an erase voltage, a read voltage, a reference cell voltage, a program current, an erase current, a read current, and/or a reference cell current. Some embodiments provide that the DC characteristic is a DC current or voltage level. In some embodiments, the AC timing characteristic is a parameter control signal time value.

Some embodiments provide that changing the at least one of the DC characteristic and the AC timing characteristic of the parameter includes generating multiple DC voltages according to a first portion of the data stored in the storage region and generating multiple AC timing signals according to a second portion of the data stored in the storage region. Embodiments may include generating a parameter control signal by mixing one of the DC voltages and one of the AC timing signals in response to selection signals, changing at least one of the DC characteristic and the AC timing characteristic of the parameter in response to the parameter control signal and accessing the non-volatile memory cell according to a changed parameter.

Some embodiments of the present invention include methods of changing a parameter in a semiconductor system that includes a semiconductor device and a controller controlling an operation of the semiconductor device. Such methods may include monitoring, using the controller, a characteristic of a memory cell of the semiconductor device, generating a data set including a command and data based on a monitoring result, and transmitting the data set to the semiconductor device. Methods may further include changing, using the semiconductor device, at least one of a DC characteristic and an AC timing characteristic of a parameter used to access the memory cell according to the data received from the controller.

In some embodiments, the characteristic of the memory cell is at least one of an endurance property of the memory cell and a retention property of the memory cell. Some embodiments provide that the DC characteristic is a DC voltage or current level and the AC timing characteristic is a parameter time.

Some embodiments of the present invention include a semiconductor device that includes a memory core including multiple non-volatile memory cells, an access block configured to access the non-volatile memory cells, and a control block configured to change, responsive to externally input data, at least one of a DC level and an AC timing characteristic of a parameter control signal that is provided to the access block to change at least one between a DC characteristic and an AC timing characteristic of a parameter used to access the non-volatile memory cells.

In some embodiments, the control block includes a voltage generation block configured to generate multiple DC voltages according to a first portion of the data, a timing generation block configured to generate multiple AC timing signals according to a second portion of the data, and a level/timing adjustment block configured to generate the parameter control signal by mixing one of the DC voltages and one of the AC timing signals in response to selection signals.

Some embodiments provide that when the access block includes a wordline driver block that drives wordlines connected with the non-volatile memory cells, the control block provides the parameter control signal to the wordline driver block.

In some embodiments, when the access block includes a program block that programs data to the non-volatile memory cells, the control block provides the parameter control signal to the program block in a program operation to change at least one of the DC characteristic and the AC timing characteristic of the parameter that defines a program time, a program voltage, or a program current.

Some embodiments provide that when the access block includes a read block that reads data from the non-volatile memory cells, the control block provides the parameter control signal to the read block in a read operation to change at least one of the DC characteristic and the AC timing characteristic of the parameter that defines a development time, a read voltage, or a read current.

In some embodiments, when the access block includes an erase block that erases the non-volatile memory cells, the control block provides the parameter control signal to the erase block in an erase operation to change at least one of the DC characteristic and the AC timing characteristic of the parameter that defines an erase time, an erase voltage, or an erase current.

Some embodiments provide that when the access block includes a reference memory cell, the control block provides the parameter control signal to the reference memory cell to change at least one of the DC characteristic and the AC timing characteristic of the parameter that defines a reference cell current or a reference cell voltage.

Some embodiments of the present invention are directed to a semiconductor system that includes a semiconductor device including a memory core that includes multiple non-volatile memory cells and a controller configured to control an operation of the semiconductor device. Some embodiments provide that the controller is configured to monitor a characteristic of the non-volatile memory cells, to generate a data set based on a monitoring result, and to transmit the data set to the semiconductor device. In some embodiments, the semiconductor device further includes a storage region configured to store data included in the data set, an access block configured to access the non-volatile memory cells, and a control block configured to change at least one between a DC level and an AC timing characteristic of a parameter control signal provided to the access block to change at least one of a DC characteristic and an AC timing characteristic of a parameter used to access the non-volatile memory cells according to the data stored in the storage region.

In some embodiments, the characteristic of the non-volatile memory cells includes at least one of endurance and retention of the non-volatile memory cells. Some embodiments provide that the controller generates the data set based on a result of comparing a monitored endurance with a reference endurance. In some embodiments, the controller generates the data set based on a result of comparing a monitored endurance with a reference endurance and based on a marginal distribution. Some embodiments provide that the controller informs a user of the monitoring result through an interface logic unit and generates the data set according to a parameter change signal input by the user through the interface logic unit.

In some embodiments, the control block includes a voltage generation block configured to generate multiple DC voltages according to a first portion of the data, a timing generation block configured to generate multiple AC timing signals according to a second portion of the data, and a level/timing adjustment block configured to generate the parameter control signal by mixing one of the DC voltages and one of the AC timing signals in response to selection signals.

Some embodiments provide that the parameter is a program time, an erase time, a read time, a program voltage, an erase voltage, a read voltage, a reference cell voltage, a program current, an erase current, a read current, and/or a reference cell current. In some embodiments, the DC characteristic is a DC level and the AC timing characteristic is a time.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

BRIEF DESCRIPTION OF THE DRAWINGS

The accompanying figures are included to provide a further understanding of the present invention, and are incorporated in and constitute a part of this specification. The drawings illustrate some embodiments of the present invention and, together with the description, serve to explain principles of the present invention.

DETAILED DESCRIPTION OF THE EMBODIMENTS

Figure 1:
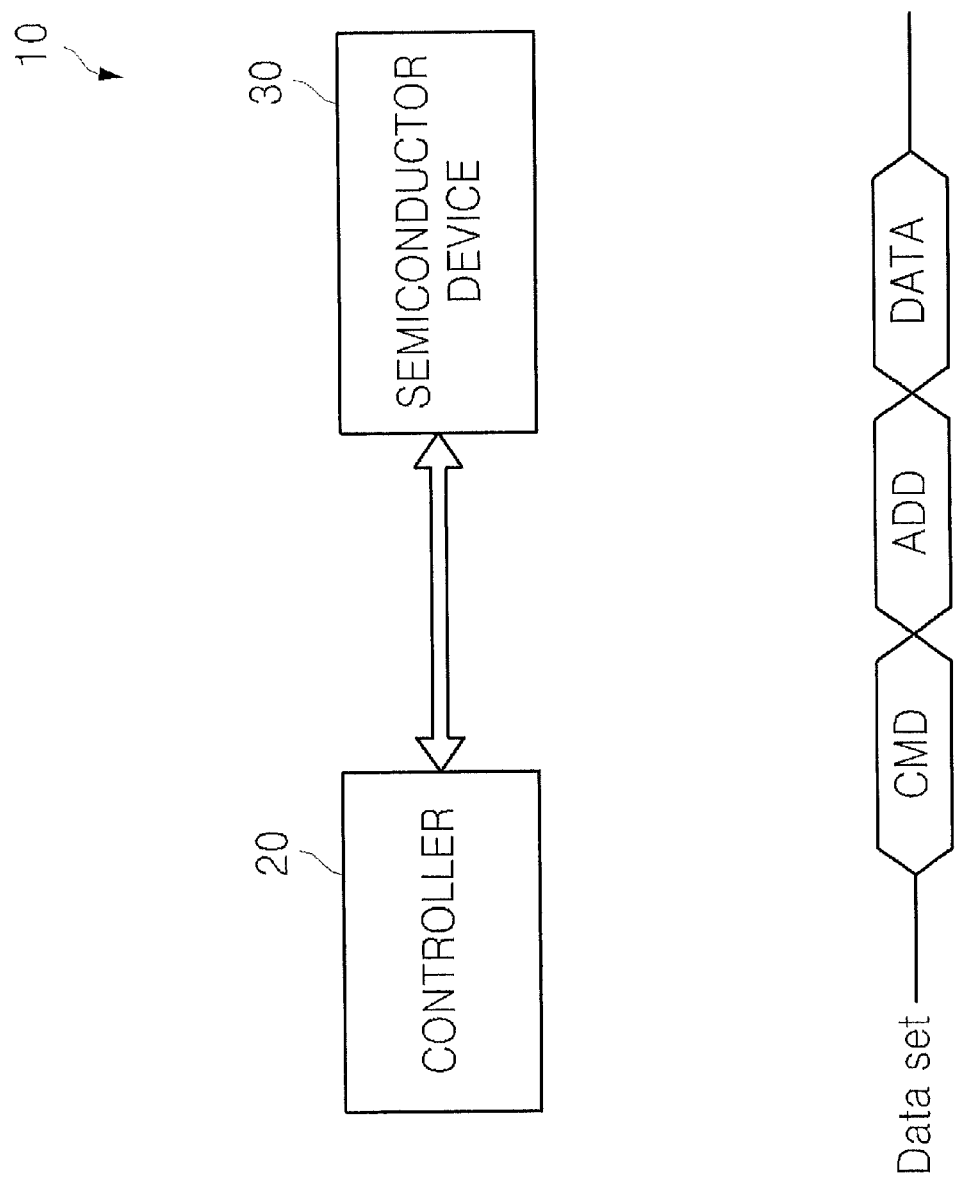
FIG. 1 illustrates a semiconductor system including a controller and a semiconductor device and a data set generated by the controller according to some embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 14:
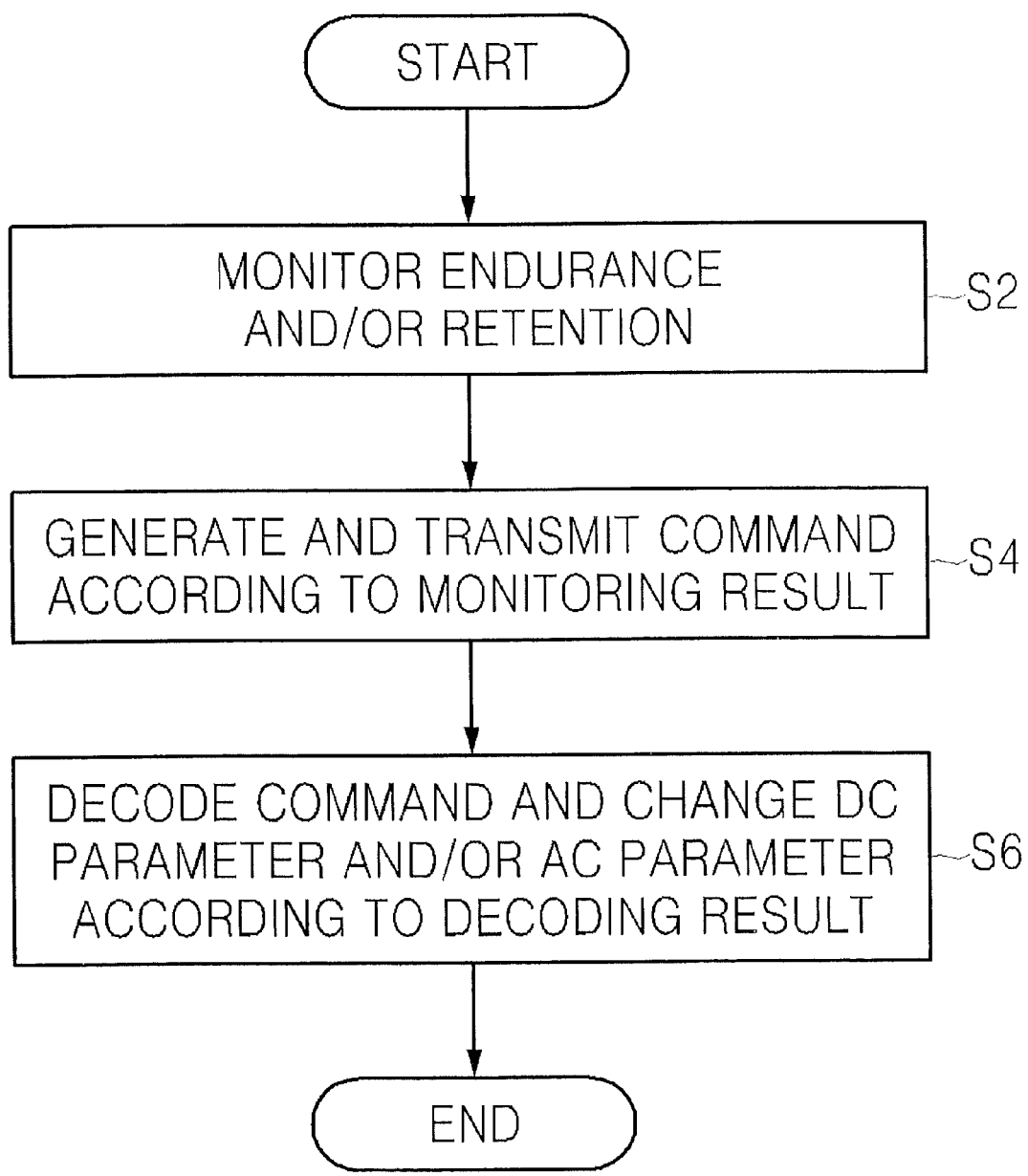
FIG. 14 is a flowchart of the operations of a semiconductor system according to some embodiments of the present invention.

FIG. 1 illustrates a semiconductor system 10 including a controller 20 and a semiconductor device 30 and a data set generated by the controller 20 according to some embodiments of the present invention. FIG. 14 is a flowchart of the operations of the semiconductor system 10 according to some embodiments of the present invention.

Referring to FIG. 1, the semiconductor system 10 includes the controller 20 and the semiconductor device (or memory device) 30. The semiconductor system 10 may be a computer (PC, notebook, or net book), a handheld terminal, a personal digital assistant (PDA), a portable multimedia player (PMP), a smart card, a memory card, an image pickup (or capture) device, a digital camera, a camcorder, a mobile communication device, a data storage device such as a solid state drive (SSD), and/or consumer equipment (CE), among others.

The controller 20 may be any control device that can generally control the program, write, read, or erase operation of the semiconductor device (or memory device) 30 including non-volatile memory cells. The controller 20 may communicate data with an external device (not shown). Referring to FIGS. 1 and 14, the controller 20 may monitor the endurance and/or retention of a non-volatile memory cell included in the semiconductor device 30 (FIG. 14, block 2).

According to the monitoring result, the controller 20 may generate a data set for changing at least one between a direct current (DC) characteristic and an alternating current (AC) timing characteristic of a parameter control signal for changing at least one between a DC characteristic and an AC timing characteristic of a parameter that defines an access operation, e.g., a program operation, a write operation, a read operation, or an erase operation, of the semiconductor device 30. The controller 20 may be implemented in hardware and may include an electronic recording medium (e.g., a microprocessor) that can be equipped with firmware, which can generate the data set.

For instance, the controller 20 may periodically and/or non-periodically monitor the endurance and/or retention of a non-volatile memory cell included in the semiconductor device 30 (FIG. 14, block 2) and, according to the monitoring result, the controller 20 may automatically generate a data set for changing at least one between the DC characteristic (e.g., a DC level) and the AC timing characteristic (e.g., a time or a period) of a parameter control signal and transmit the data set to the semiconductor device 30 (FIG. 14, block 4). Thereafter, the semiconductor device 30 may decode a command CMD included in the received data set and change at least one between the predetermined DC characteristic of a parameter (referred to as a "DC parameter") and the predetermined AC timing characteristic of the parameter (referred to as an "AC parameter") according to data DATA included in the data set (FIG. 14, block 6).

For instance, the controller 20 may generate a data set including a command CMD, an address ADD, and/or data DATA in response to a parameter change signal input by a user or according to a result of monitoring the operation characteristics (e.g., at least one between endurance and retention) of the semiconductor device 30 and transmit the data set to the semiconductor device 30 via a wired and/or wireless connection (FIG. 14, block 4). The address ADD may be a signal indicating a storage region, e.g., a position in a register 43 (FIG. 2), in which the data DATA will be stored in the semiconductor device 30. The data DATA is related with at least one between the DC characteristic and the AC timing characteristic of a parameter to be changed.

Parameters that can be changed according to a data set may be voltage levels and/or current levels for indicating the DC and operating characteristics defined in the specification of the semiconductor device 30. For instance, a parameter that can be changed according to a data set output from the controller 20 may be a wordline voltage, a program voltage, an erase voltage, a read voltage, a reference cell voltage, a program current, an erase current, a read current, and/or a reference cell current, among others, of the semiconductor device 30. Some embodiments provide that the parameters that can be changed according to the data set may be times, e.g., a development time T_RDEV (FIG. 12), an erase time T_RESET (FIG. 13), and/or a program time T_SET (FIG. 13), among others, indicating AC timing characteristics.

The semiconductor device 30 may receive the data set including the command CMD, the address ADD, and the data DATA, decode the command CMD, and store the data DATA in the register 43 indicated by the address ADD. The data DATA may be used for changing at least one between the DC characteristic and the AC timing characteristic of a parameter control signal. Accordingly, an access block may change at least one between the DC characteristic and the AC timing characteristic of a parameter according to the parameter control signal. In addition, some embodiments provide that the access block may access a memory core 60 (FIG. 2) according to a changed parameter.

The semiconductor device 30 may change at least one of the predetermined DC characteristic and the predetermined AC timing characteristic of the parameter according to the data DATA stored in the register 43. For instance, the semiconductor device 30 may change at least one of the DC characteristics (e.g., a DC voltage level or a DC current level) and the AC timing characteristics (e.g., a time or a period) of the parameter control signal, which may be provided to the access block performing the program, write, read or erase operation, according to the received data DATA (FIG. 14, block 6).

Consequently, the controller 20 may change parameters, which have been set by manufacturers of the controller 20 and the semiconductor 30 during manufacturing, during operation. Some embodiments provide that the controller may change any parameter at any time according to the use state of the semiconductor device 30. As a result, when fail data occurs, the controller 20 and/or the semiconductor device 30 can recover the fail data according to the changed parameter. The controller 20 of the semiconductor system 10 may include an interface logic unit (not shown) to inform a user of the monitoring result. The user may input a parameter change signal through the interface logic unit.

Figure 2:
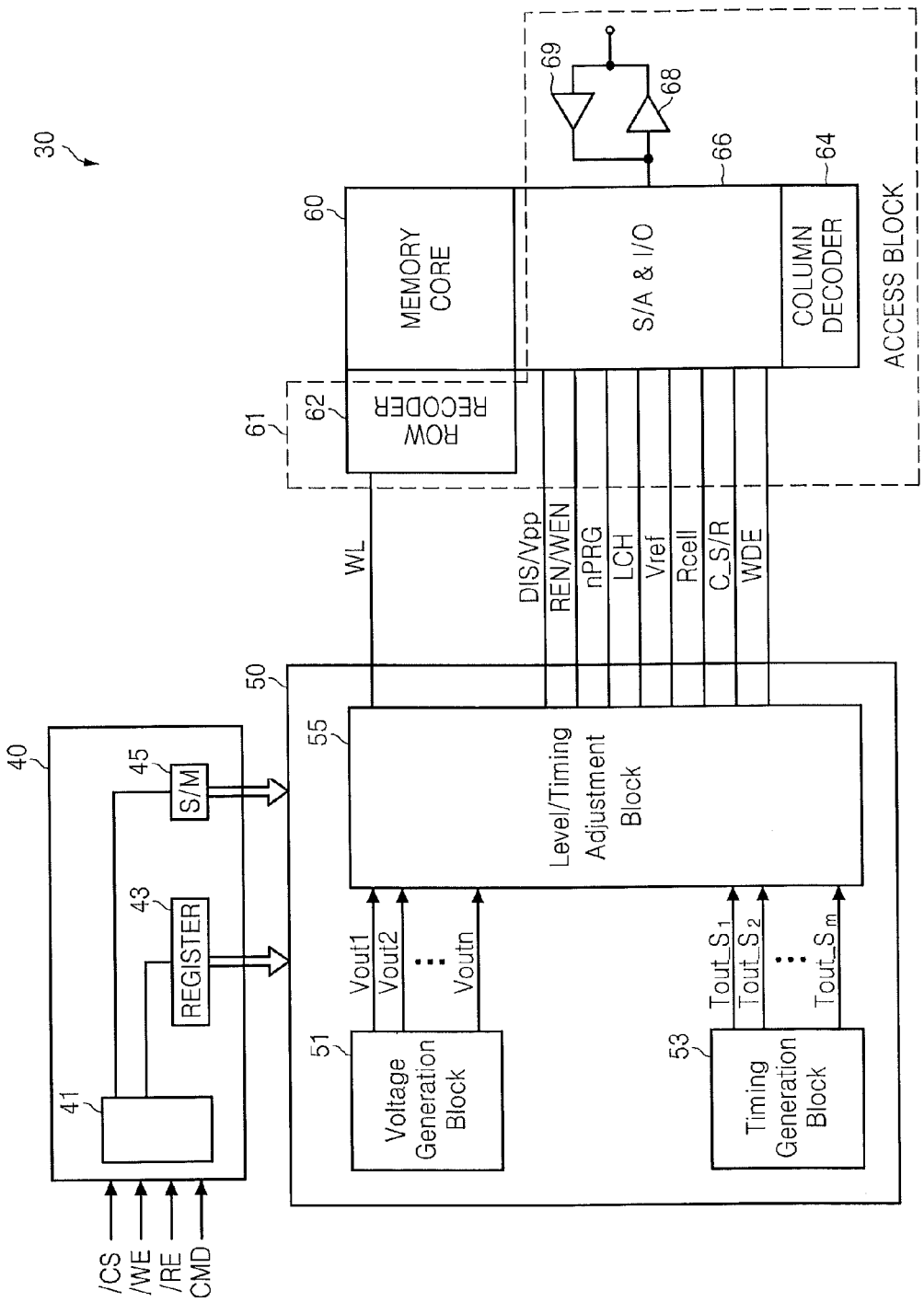
FIG. 2 is a block diagram of a semiconductor device according to some embodiments of the present invention.

Reference is made to FIG. 2, which is a block diagram of the semiconductor device 30 according to some embodiments of the present invention. The semiconductor device 30 includes a control/register block 40, a control block 50, an access block, and the memory core 60. The control/register block 40 may access the memory core 60 under the control of a control logic unit 41. The control/register block 40 may decode the command CMD output from the controller 20 and store the data DATA in a storage region of the register 43 indicated by the address ADD under the control of the control logic unit 41. The control logic unit 41 of the control/register block 40 may control the operation of a state machine 45. The control logic unit 41 may receive and decode a plurality of control signals /CS, /WE, /RE, and CMD output from the controller 20 and output decoded signals to at least one among the register 43, the state machine 45, the control block 50, the access block, and/or the memory core 60.

The plurality of control signals /CS, /WE, /RE, and CMD may include a chip selection signal /CS for enabling the semiconductor device 30, a write enable signal /WE for instructing the start of a write operation, a read enable signal /RE for instructing the start of a read operation, and a data set including the command CMD and the data DATA according to some embodiments of the present invention. The control logic unit 41 may receive the command CMD of the data set and store the data DATA for changing at least one between the DC characteristic and the AC timing characteristic of a parameter in a region of the register 43 indicated by the address ADD according to a result of decoding the command CMD.

According to some embodiments of the present invention, the command CMD for instructing to change a parameter has a unique value and is distinguished from a command instructing an access operation (e.g., a program operation, a write operation, a read operation, or erase operation) of the semiconductor device 30.

The state machine 45 may output control signals for controlling the access operation of the semiconductor device 30 to the control block 50. For instance, in the read operation, the state machine 45 may output control signals necessary to perform bitline discharge, bitline precharge, development, sensing, and/or latch illustrated in FIG. 12 to the control block 50. The control block 50 may change at least one between the DC characteristic and the AC timing characteristic of a parameter control signal (e.g., WL, DIS/Vpp, REN/WEN, nPRG, LCH, Vref, Rcell, C_S/R, and/or WDE), which is provided to the access block to access a plurality of non-volatile memory cells included in the memory core 60, according to the data DATA stored in the register 43. Some embodiments provide that the control block 50 includes a voltage generation block 51, a timing generation block 53, and a level/timing adjustment block 55.

In some embodiments, the voltage generation block 51 may generate a plurality of DC voltages Vout1 through Voutn (where "n" is a natural number) respectively having different DC levels according to a first portion, e.g., first control bits, of the data DATA stored in the register 43. The timing generation block 53 may generate a plurality of timing signals Tout_S$_1$ through Tout_S$_m$ (where "m" is a natural number) respectively having different timings (e.g., times or periods) according to a second portion, e.g., second control bits, of the data DATA stored in the register 43. The level/timing adjustment block 55 may receive the DC voltages Vout1 through Voutn from the voltage generation block 51 and the timing signals Tout_S$_1$ through Tout_S$_m$ from the timing generation block 53 and mix the DC voltages Vout1 through Voutn with the timing signals Tout_S$_m$ through Tout_S$_m$ in response to the control signals output from the state machine 45, thereby generating at least one parameter control signal WL, DIS/Vpp, REN/WEN, nPRG, LCH, Vref, Rcell, C_S/R, and/or WDE.

Each parameter control signal WL, DIS/Vpp, REN/WEN, nPRG, LCH, Vref, Rcell, C_S/R, and/or WDE illustrated in FIG. 2 may indicate a control signal for changing at least one of the DC characteristic and the AC timing characteristic of a parameter in some embodiments of the present invention. Some embodiments provide that each parameter control signal WL, DIS/Vpp, REN/WEN, nPRG, LCH, Vref, Rcell, C_S/R, and/or WDE illustrated in FIG. 2 may indicate a parameter itself in some embodiments disclosed herein.

The structure and the operations of the control block 50 will be described in detail with reference to FIGS. 3 through 9. The access block is a block that may access the memory core 60 in the program, write, read and/or erase operation and may include a row decoder 62, a column decoder 64, a write/read buffer block 66, an output buffer 68, and/or an input buffer 69, among others. In some embodiments of the present invention, when the access block includes a wordline driver block, e.g., the row decoder 62, for driving a wordline connected to a plurality of non-volatile memory cells in the memory core 60, the control block 50 may provide the parameter control signal WL for changing at least one between the DC characteristic (e.g., the DC level) and the AC timing characteristic (e.g., the time) of a parameter (e.g., a wordline driving voltage) to the wordline driver block.

Figure 13:
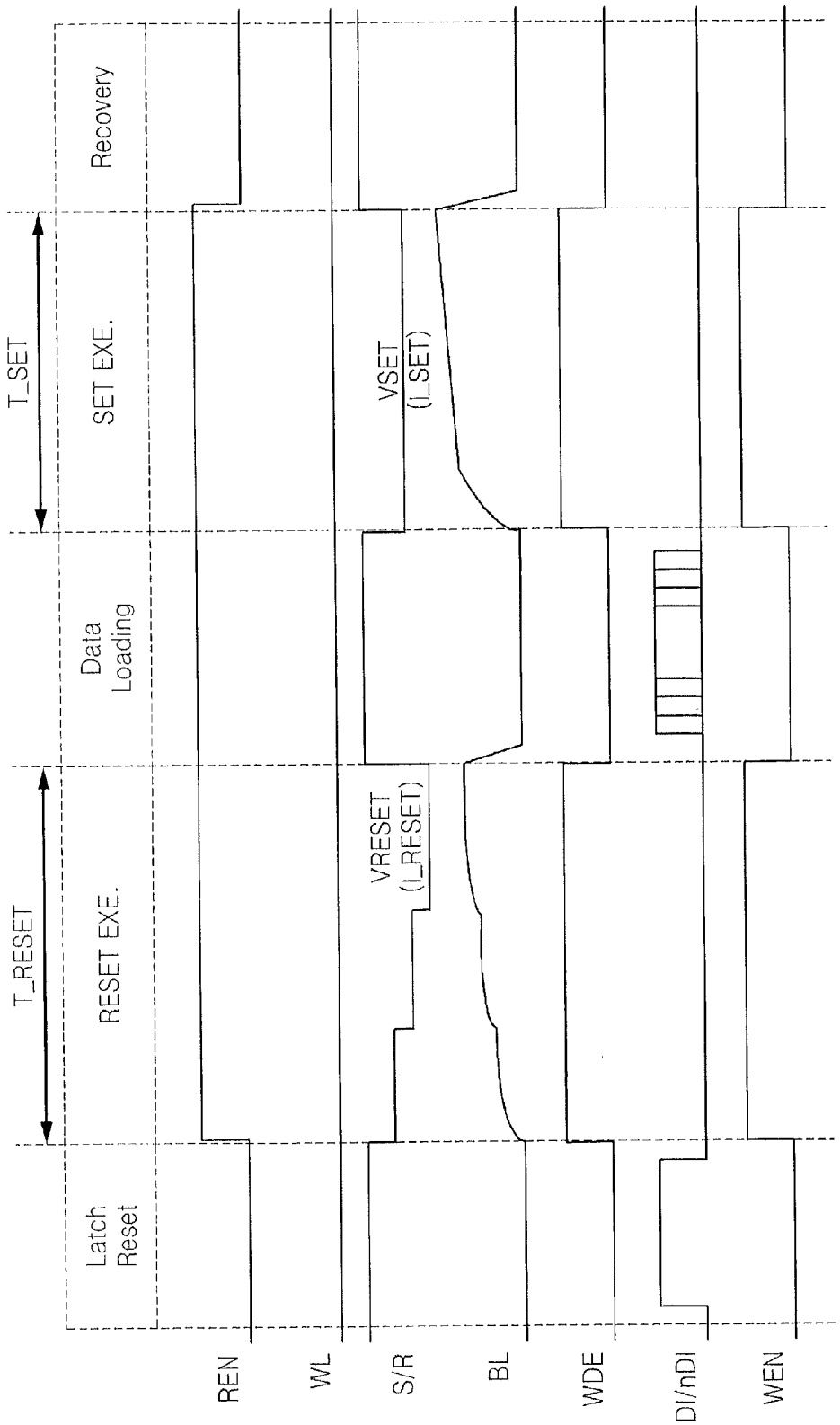
FIG. 13 is a timing chart of the write operation of the semiconductor device illustrated in FIG. 2.

In some embodiments, when the access block includes a program block, e.g., the write/read buffer block 66, for programming data to non-volatile memory cells in the memory core 60, the control block 50 may provide the parameter control signal (e.g., S/R in FIG. 13 or C_S/R for controlling S/R) for changing at least one of the DC characteristic and the AC timing characteristic of a parameter (e.g., a program time T_SET, a program voltage VSET, or a program current I_SET in FIG. 13) to the program block in the program operation.

Figure 12:
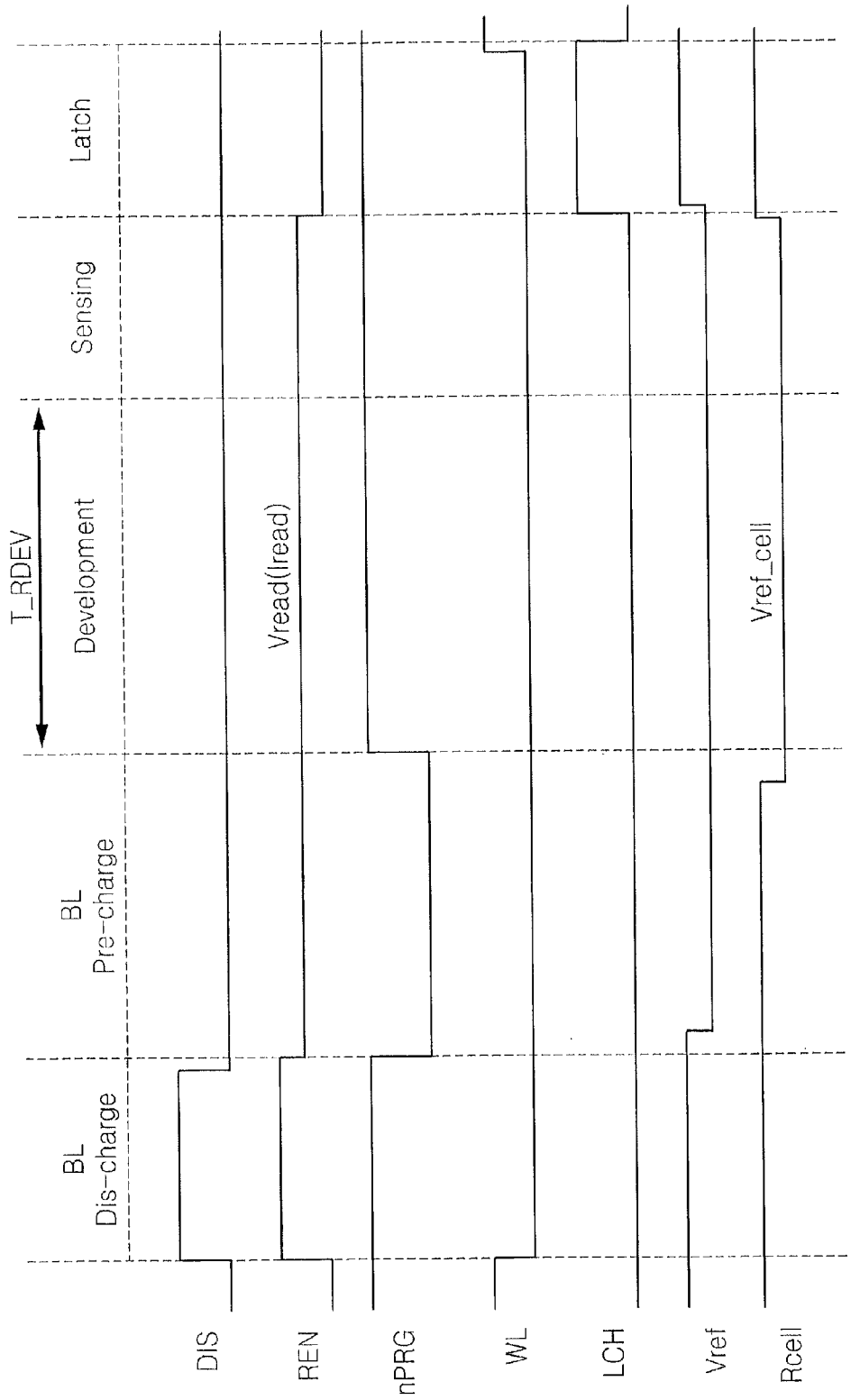
FIG. 12 is a timing chart of the read operation of the semiconductor device illustrated in FIG. 2.

In some embodiments, when the access block includes a read block, e.g., the write/read buffer block 66, for read data from non-volatile memory cells in the memory core 60, the control block 50 may provide the parameter control signal REN and/or nPRG for changing at least one of the DC level and the AC timing characteristic of a parameter (e.g., a development time T_RDEV, a read voltage Vread, or a read current Iread in FIG. 12) to the read block in the read operation.

In some embodiments of the present invention, when the access block includes an erase block, e.g., the write/read buffer block 66, for erasing non-volatile memory cells in the memory core 60, the control block 50 may provide the parameter control signal (e.g., S/R in FIG. 13 or C_S/R for controlling S/R) for changing at least one of the DC level and the AC timing characteristic of a parameter (e.g., an erase time T_RESET, an erase voltage VRESET, or an erase current I_RESET in FIG. 13) to the erase block in the erase operation.

Figure 10:
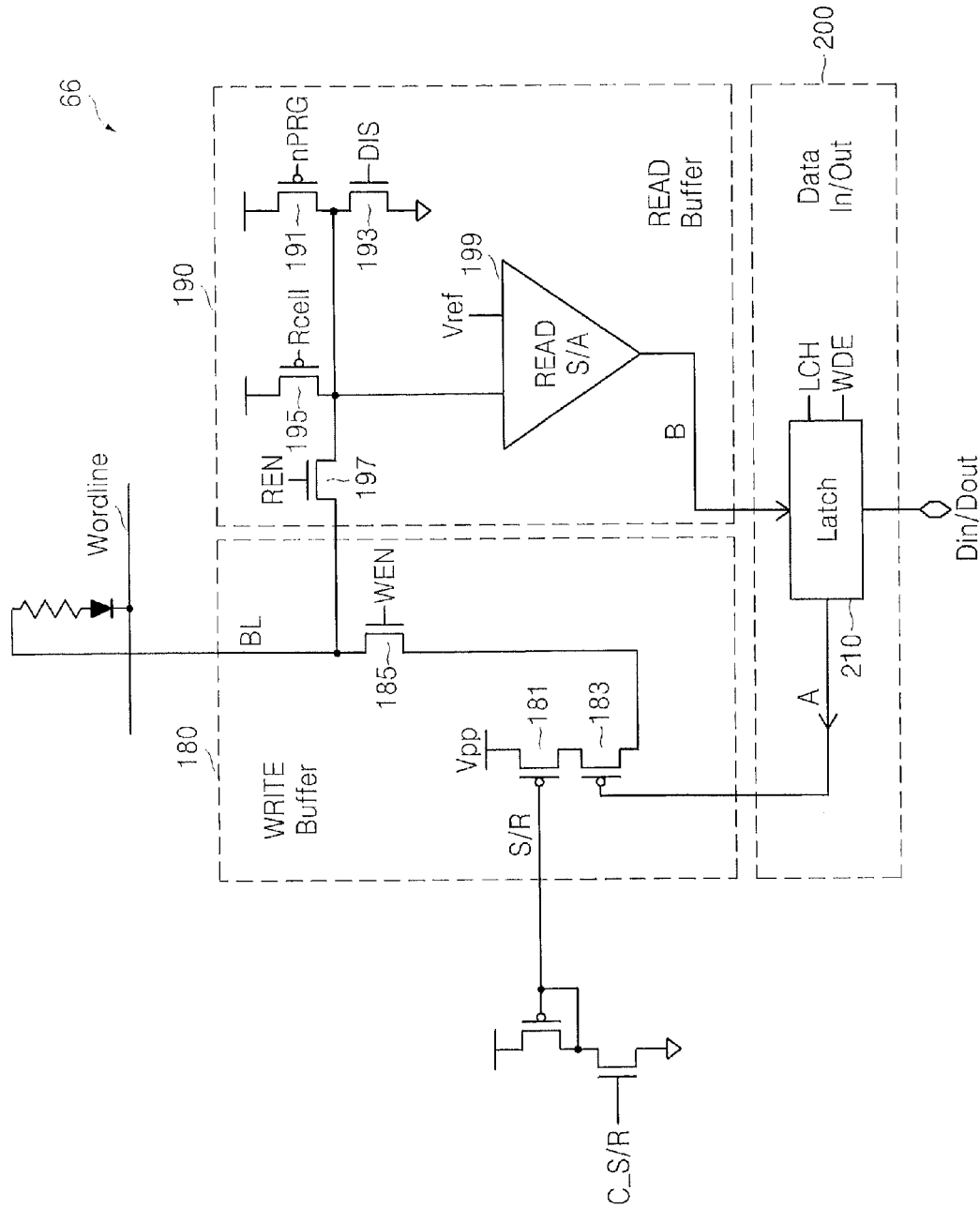
FIG. 10 is a circuit diagram of a write/read buffer block illustrated in FIG. 2.

In some embodiments, when the access block includes a reference memory cell (e.g., a transistor 195 in FIG. 10), the control block 50 may provide the reference memory cell with the parameter control signal Rcell for changing a reference cell voltage (Vref_cell in FIG. 12) or at least one of the DC level and the AC timing characteristic of the reference cell voltage (or a current flowing in the transistor 195 in FIG. 10 due to the reference cell voltage Rcell).

The memory core 60 includes a plurality of wordlines, a plurality of bitlines, and a plurality of non-volatile memory cells. The non-volatile memory cells may be implemented by electrically erasable programmable read-only memory (EEPROM) cells, flash memory cells, resistive random access memory (ReRAM) cells, phase-change RAM (PRAM) cells, ferroelectric RAM (FeRAM) cells, and/or magnetoresistive RAM (MRAM) cells, among others.

Figure 3:
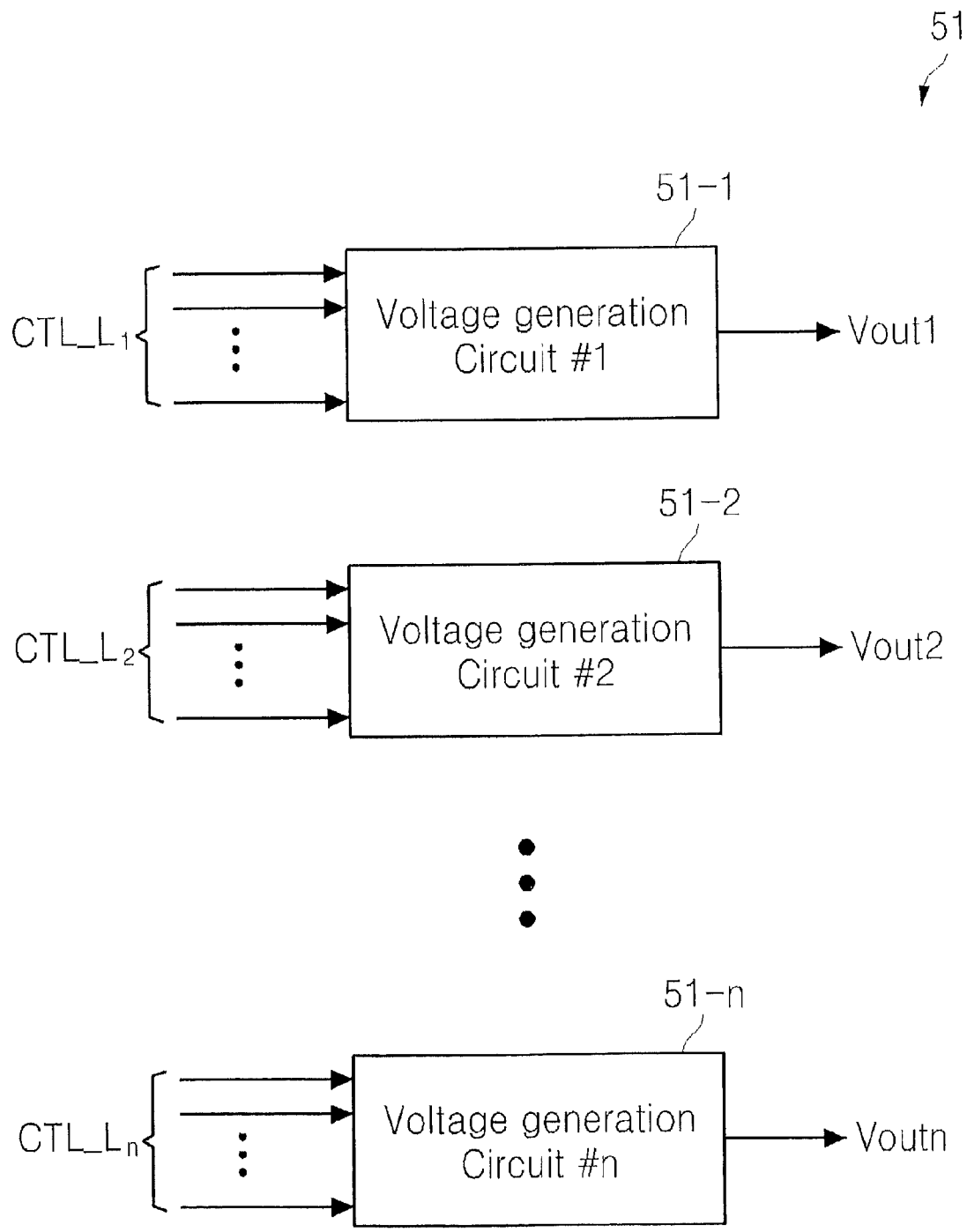
FIG. 3 is a block diagram of a voltage generation block illustrated in FIG. 2.

Reference is now made to FIG. 3, which is a block diagram of the voltage generation block 51 illustrated in FIG. 2. The voltage generation block 51 includes a plurality of voltage generation circuits 51-1 through 51-n. The first voltage generation circuit 51-1 may control the DC level of a first voltage Vout1 in response to a control bit set $CTL\_L_1$ corresponding to a portion of the data DATA stored in the register 43 and may output the first voltage Vout1 to control the DC level thereof. The second voltage generation circuit 51-2 may control the DC level of a second voltage Vout2 in response to a control bit set $CTL\_L_2$ corresponding to another portion of the data DATA stored in the register 43 and may output the second voltage Vout2 to control the DC level thereof. The n-th voltage generation circuit 51-n may control the DC level of an n-th voltage Voutn in response to a control bit set $CTL\_L_n$ corresponding to a further portion of the data DATA stored in the register 43 and may output the n-th voltage Voutn to control the DC level thereof. The voltages Vout1 through Voutn may have different DC levels.

Figure 4:
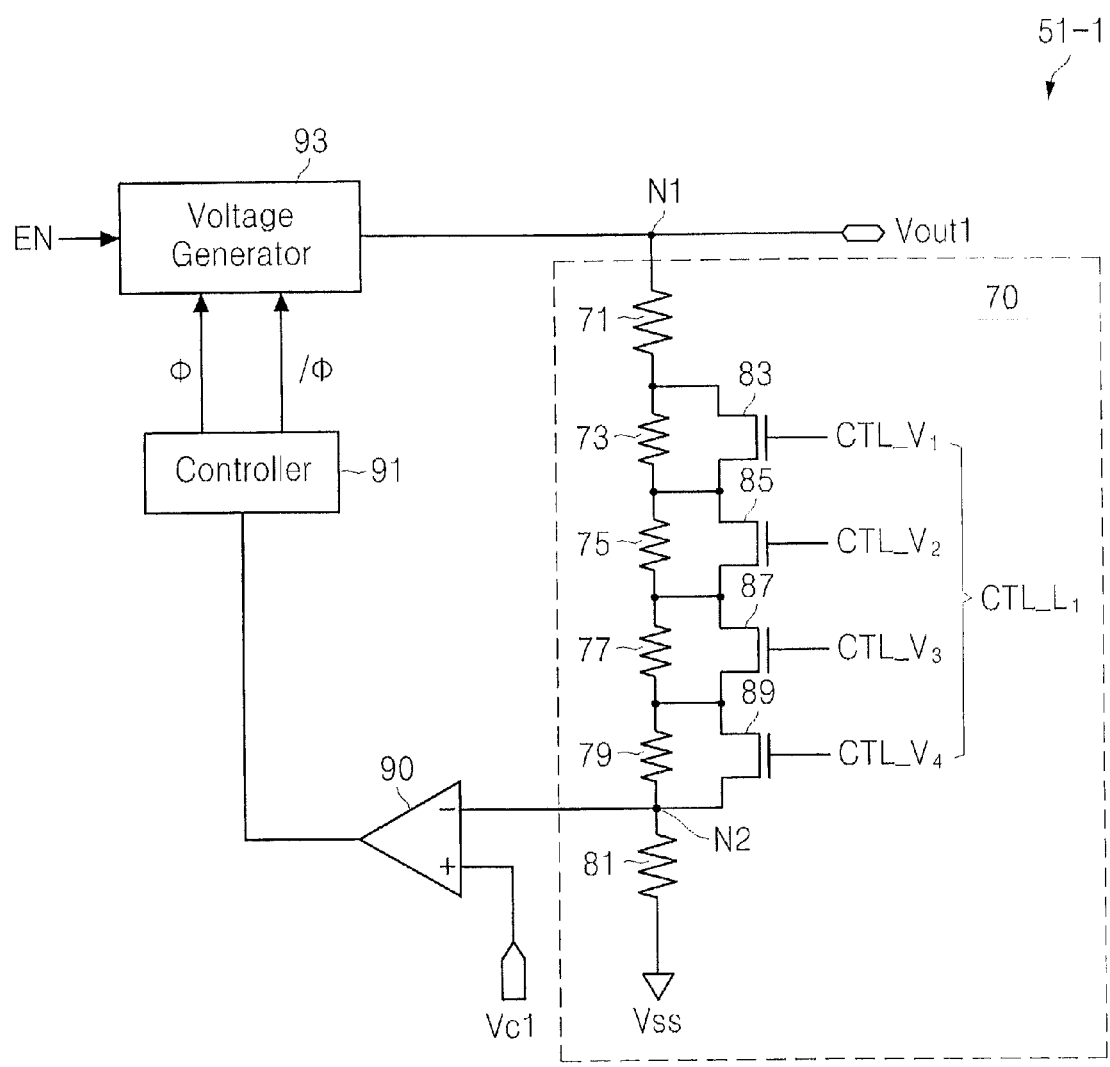
FIG. 4 is a circuit diagram of a first voltage generation circuit illustrated in FIG. 3.

Reference is now made to FIG. 4, which is a circuit diagram of the first voltage generation circuit 51-1 illustrated in FIG. 3. For clarity of the description, the first voltage generation circuit 51-1 only is illustrated. The voltage generation circuits 51-1 through 51-n receive different control bit sets $CTL\_L_1$ through $CTL\_L_n$ but have substantially the same structure.

The first voltage generation circuit 51-1 includes a voltage regulator 70, a comparator 90, a controller 91, and a voltage generator 93. The voltage regulator 70 may regulate the level of the first voltage Vout1 in response to the control bit set $CTL\_L_1$. The voltage regulator 70 may include a plurality of resistors 71, 73, 75, 77, 79, and 81 connected in series between an output terminal N1 and a ground Vss and a plurality of switching circuits 83, 85, 87, and 89.

The switching circuits 83, 85, 87, and 89 are respectively connected in parallel with the resistors 73, 75, 77, and 79 and perform a switching operation in response to control bits $CTL\_V_1$, $CTL\_V_2$, $CTL\_V_3$, and $CTL\_V_4$, respectively, composing the control bit set $CTL\_L_1$. Some embodiments provide that the voltage regulator 70 operates in response to the four control bits $CTL\_V_1$ through $CTL\_V_4$ in FIG. 4. The total resistance value of the resistors 71 through 81 connected in series between the output terminal N1 and the ground Vss may vary with each of the control bits $CTL\_V_1$ through $CTL\_V_4$.

The comparator 90 may compare a voltage at a node N2 with a first reference voltage Vc1 and output a comparison signal according to the comparison result. Some embodiments provide that the voltage at the second node N2 is input to a negative (−) terminal of the comparator 90 and the first reference voltage Vc1 is input to a positive (+) terminal of the comparator 90, however, the terminations may be provided vice versa in some embodiments disclosed herein. The controller 91 may generate a plurality of control signals Φ and /Φ in response to the comparison signal. The control signals Φ and /Φ may be differential signals or complementary signals. In addition, the control signals Φ and /Φ may have a non-overlap portion. In some embodiments, the controller 91 may be implemented by an oscillator.

The voltage generator 93 may be enabled in response to an enable signal EN that is output from the state machine 45 and may generate the first voltage Vout1 in response to the control signals Φ and /Φ. Some embodiments provide that the voltage generator 93 may be implemented by a charge pump. The first voltage generation circuit 51-1 may output the first voltage Vout1 corresponding to a level that is controlled according to the control bits $CTL\_V_1$ through $CTL\_V_4$.

Figure 5:
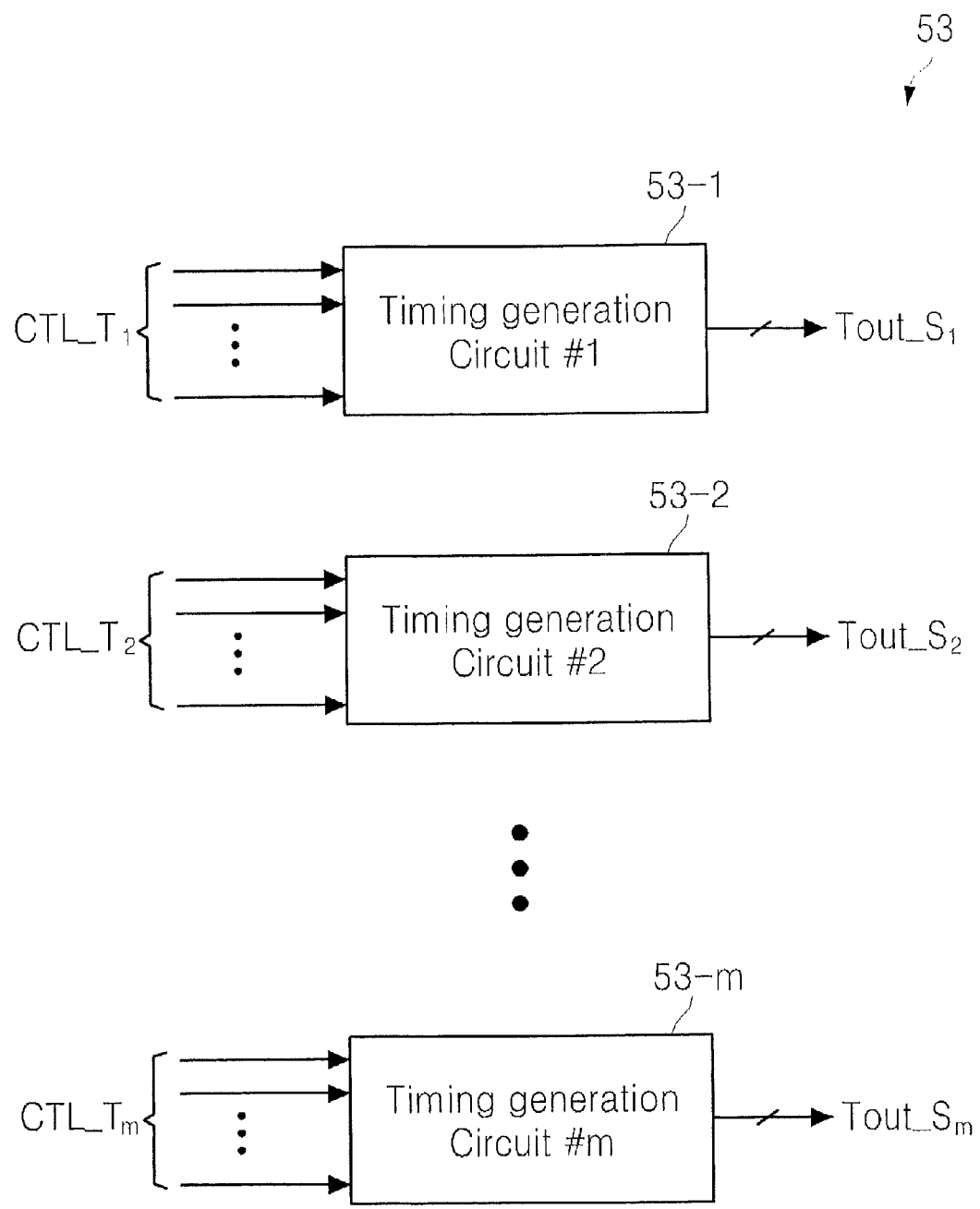
FIG. 5 is a block diagram of a timing generation block illustrated in FIG. 2.

Reference is now made to FIG. 5, which is a block diagram of the timing generation block 53 illustrated in FIG. 2. Some embodiments provide that the timing generation block 53 includes a plurality of timing generation circuits 53-1 through 53-m. The first timing generation circuit 53-1 may generate a plurality of timing signals $Tout\_S_1$ in response to a control bit set $CTL\_T_1$ corresponding to a portion of the data DATA stored in the register 43. The timing signals $Tout\_S_1$ may have different timings, e.g., periods. The second timing generation circuit 53-2 may generate a plurality of timing signals $Tout\_S_2$ in response to a control bit set $CTL\_T_2$ corresponding to another portion of the data DATA stored in the register 43. The timing signals $Tout\_S_2$ may have different timings, e.g., periods. The m-th timing generation circuit 53-m may generate a plurality of timing signals $Tout\_S_m$ in response to a control bit set $CTL\_T_m$, corresponding to a further portion of the data DATA stored in the register 43. The timing signals $Tout\_S_m$ may have different timings, e.g., periods. Accordingly, all timing signals $Tout\_S_1$ through $Tout\_S_m$ generated by the timing generation block 53 may have different periods. Some other embodiments provide that each of the timing generation circuits 53-1 through 53-m may generate a single timing signal.

Figure 6:
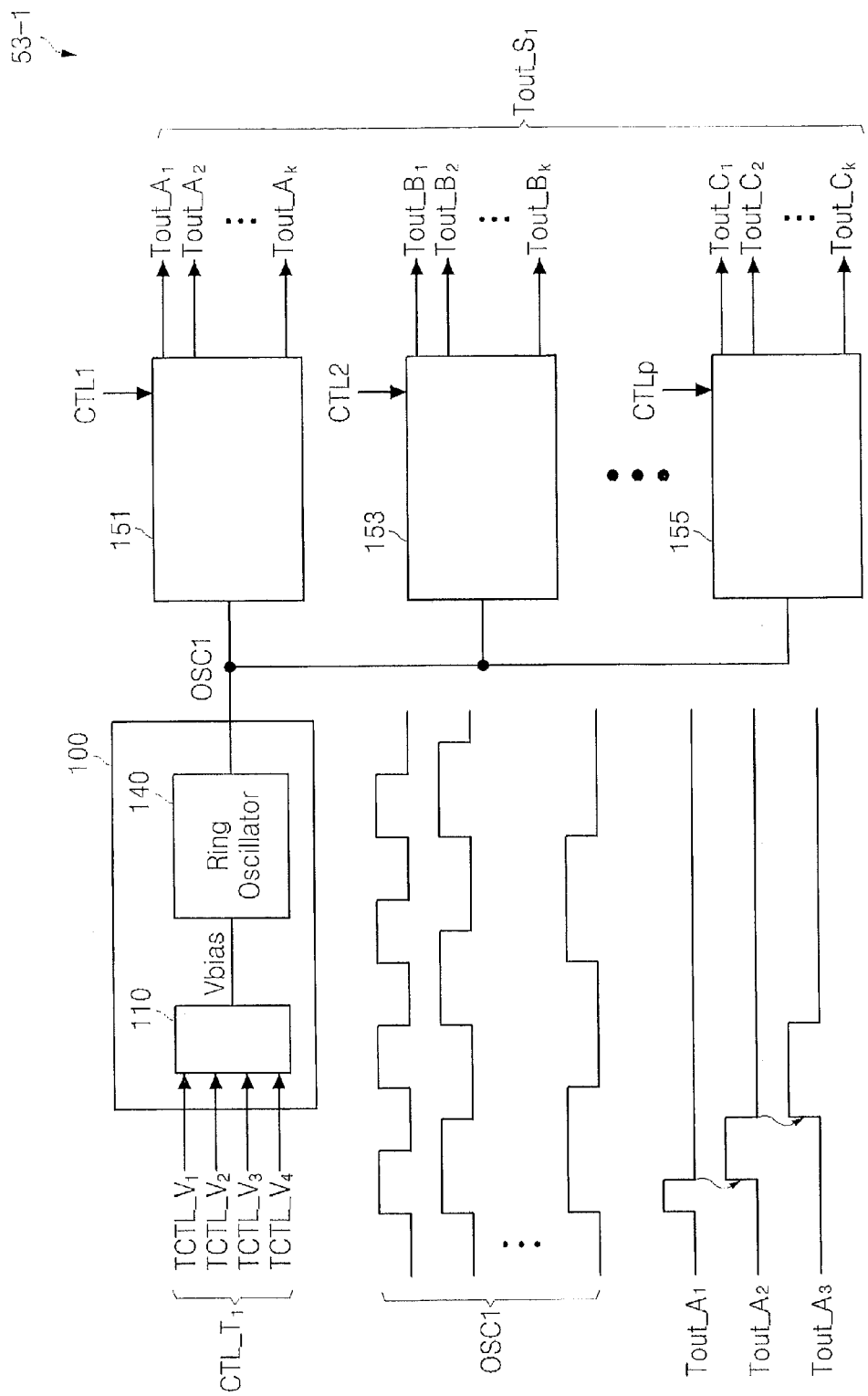
FIG. 6 is a circuit diagram of a first timing generation circuit illustrated in FIG. 5.

Reference is now made to FIG. 6, which is a circuit diagram of the first timing generation circuit 53-1 illustrated in FIG. 5. For clarity of the description, the first timing generation circuit 53-1 only is illustrated. The timing generation circuits 53-1 through 53-m may receive different control bit sets $CTL\_T_1$ through $CTL\_T_m$ but may have substantially the same structure.

In some embodiments, the first timing generation circuit 53-1 includes an oscillation block 100 and one or more timing generators 151, 153, and 155. The oscillation block 100 may generate a period-controlled oscillation signal OSC1 in response to the control bit set $CTL\_T_1$. Each of the timing generators 151, 153, and 155 may generate one or more timing signals $Tout\_S_1$ having different periods in response to a control signal CTL1, CTL2, or CTLp (where "p" is an integer), respectively, output from the state machine 45.

For instance, the first timing generator 151 may generate a plurality of timing signals $Tout\_A_1$ through $Tout\_A_k$ (where "k" is a natural number) having different periods in response to the oscillation signal OSC1 and at least one control signal CTL1 output from the state machine 45. The second timing generator 153 may generate a plurality of timing signals $Tout\_B_1$ through $Tout\_B_k$ having different periods in response to the oscillation signal OSC1 and at least one control signal CTL2 output from the state machine 45. The p-th timing generator 155 may generate a plurality of timing signals $Tout\_C_1$ through $Tout\_C_k$ having different periods in response to the oscillation signal OSC1 and at least one control signal CTLp output from the state machine 45. Some embodiments provide that ones of and/or each of the timing generators 151, 153, and 155 may generate a single timing signal.

Figure 7:
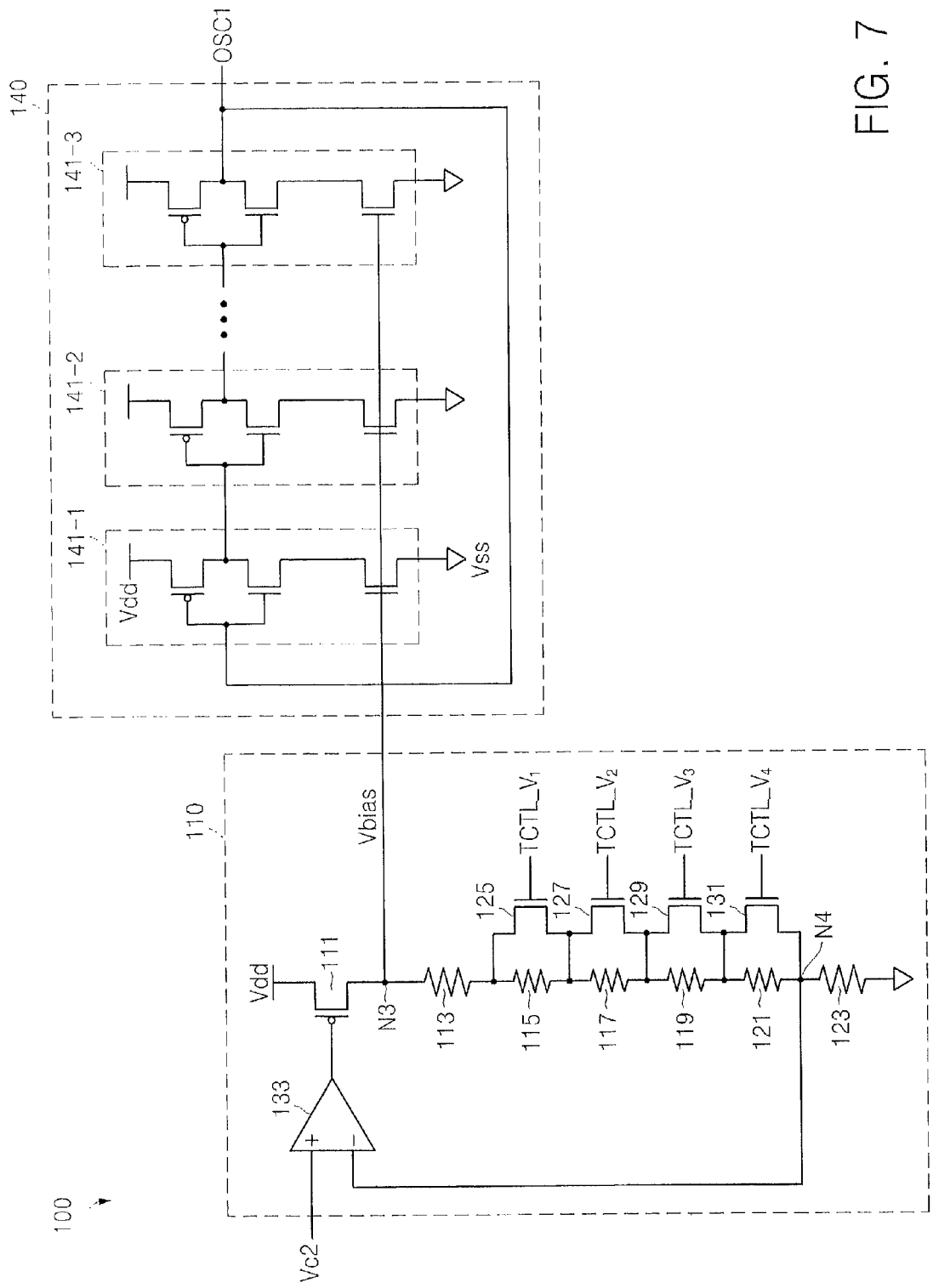
FIG. 7 is a circuit diagram of an oscillation block illustrated in FIG. 6.

Reference is now made to FIG. 7, which is a circuit diagram of the oscillation block 100 illustrated in FIG. 6. In some embodiments, the oscillation block 100 includes a bias voltage generator 110 and a ring oscillator 140. The bias voltage generator 110 may include a switch 111, a plurality of resistors 113, 115, 117, 119, 121, and 123, a plurality of switches 125, 127, 129, and 131, and a comparator 133. Some embodiments provide that the resistors 113 through 123 and the switches 125 through 131 may form a voltage regulator.

The switch 111 may be connected between a power supply Vdd and an output terminal N3 and perform a switching operation in response to an output signal of the comparator 133. The switch 111 may be implemented by a metal-oxide semiconductor field effect transistor (MOSFET), among others. The resistors 113 through 123 may be connected in series between the output terminal N3 and the ground Vss. The switches 125 through 131 may be connected in parallel with the resistors 115 through 123, respectively, and perform a switching operation in response to control bits $TCTL\_V_1$ through $TCTL\_V_4$, respectively, composing the control bit set $CTL\_T_1$.

The comparator 133 may compare a second reference voltage Vc2 with a voltage at a node N4 and generate a comparison signal for controlling the switching operation of the switch 111 according to the comparison result.

The bias voltage generator 110 may generate a level-controlled bias voltage Vbias in response to the second reference voltage Vc2 and the control bits $TCTL\_V_1$ through $TCTL\_V_4$. The ring oscillator 140 may include a plurality of stage cells 141-1 through 141-3 connected in a ring shape. Each of the stage cells 141-1 through 141-3 may include an inverter and a bias circuit. The period of the oscillation signal OSC1 may be controlled by the level of the bias voltage Vbias applied to the bias circuit. Examples of the oscillation signal OSC1 that can be generated are shown in FIG. 6.

Some embodiments provide that the last stage cell 141-3 outputs the oscillation signal OSC1 in FIG. 7. In some embodiments, an output signal of any one of the stage cells 141-1 through 141-3 may be used as the oscillation signal OSC1.

Figure 8:
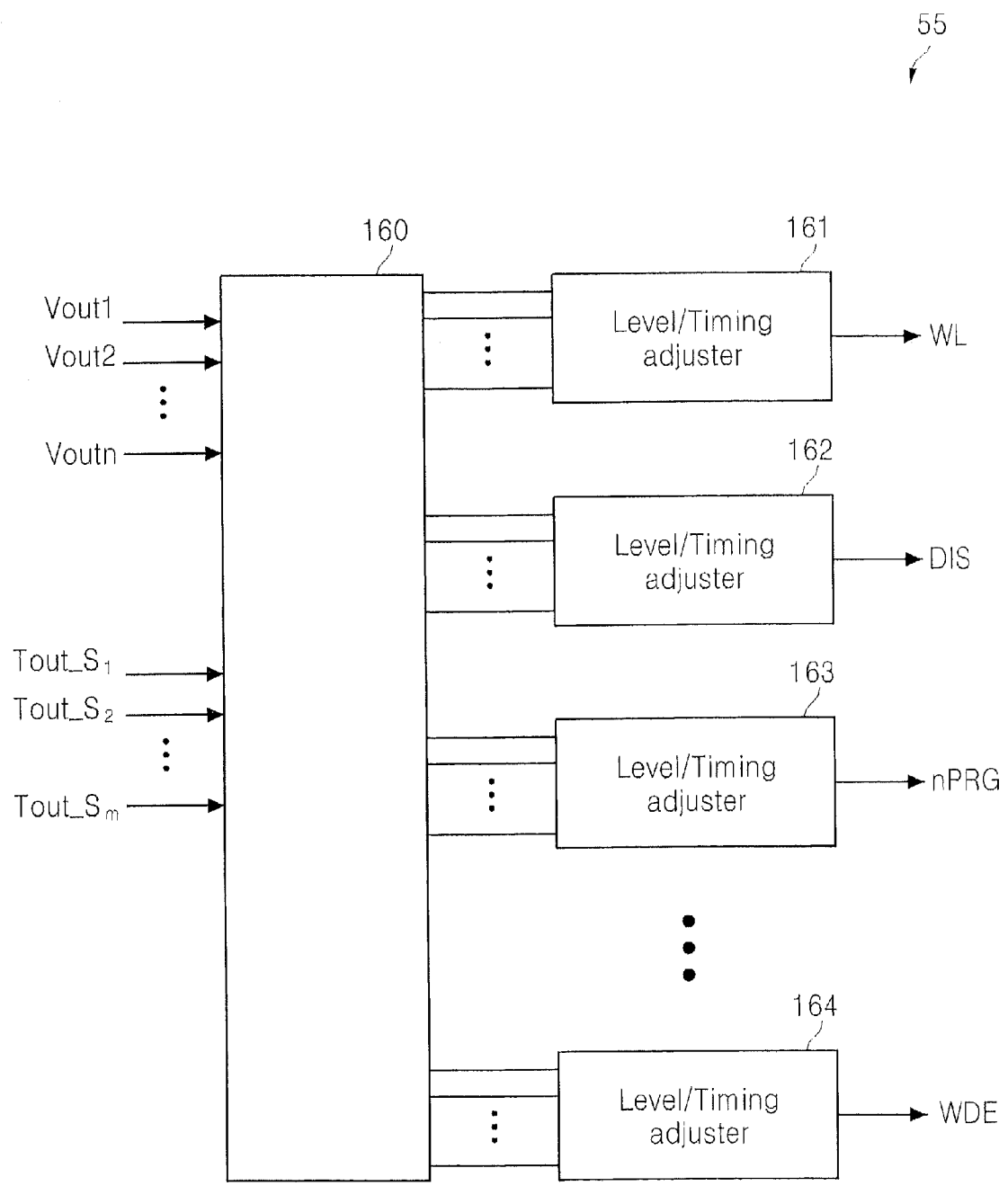
FIG. 8 is a block diagram of a level/timing adjustment block illustrated in FIG. 2.

Reference is now made to FIG. 8, which is a block diagram of the level/timing adjustment block 55 illustrated in FIG. 2. In some embodiments, the level/timing adjustment block 55 includes a wiring circuit 160 and a plurality of level/timing adjusters 161 through 164. The wiring circuit 160 may provide the voltages Vout1 through Voutn generated by the voltage generation block 51 and the timing signals $Tout\_S_1$ through $Tout\_S_m$ generated by the timing generation block 53 to the level/timing adjusters 161 through 164. For instance, the wiring circuit 160 may control such that the level/timing adjusters 161 through 164 are provided with different or the same numbers of voltages Vout1 through Voutn and timing signals $Tout\_S_1$ through $Tout\_S_m$. In other words, the numbers of voltages Vout1 through Voutn and the timing signals $Tout\_S_1$ through $Tout\_S_m$ used by the first level/timing adjuster 161 may be different those used by the second, third, or fourth level/timing adjusters 162, 163, or 164.

Figure 9:
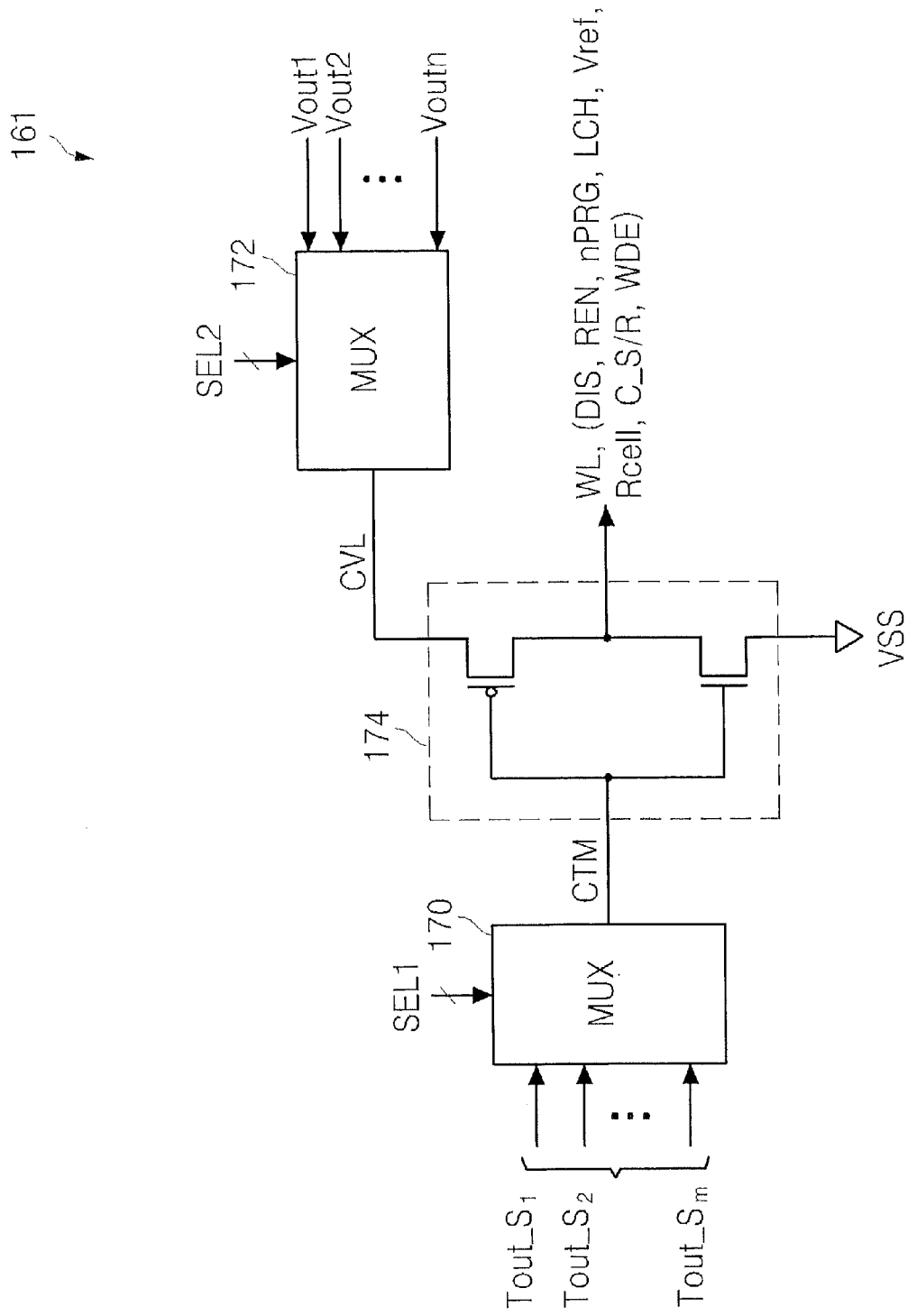
FIG. 9 is a block diagram of a first level/timing adjuster illustrated in FIG. 8.

Reference is now made to FIG. 9, which is a block diagram of the first level/timing adjuster 161 illustrated in FIG. 8. For clarity of the description, the first level/timing adjuster 161 only is illustrated in FIG. 9. The level/timing adjusters 161 through 164 may have substantially the same structures and the numbers of voltages Vout1 through Voutn and timing signals $Tout\_S_1$ through $Tout\_S_1$, input to each of the level/timing adjusters 161 through 164 may be the same and/or different among the level/timing adjusters 161 through 164.

In some embodiments, the first level/timing adjuster 161 includes a first selection circuit 170, a second selection circuit 172, and a buffer 174. The first selection circuit 170 may output one of the timing signals $Tout\_S_1$ through $Tout\_S_m$ in response to at least one first selection signal SEL1. Some embodiments provide that the first selection circuit 170 may be implemented by a multiplexer (MUX). The second selection circuit 172 may output one of the voltages Vout1 through Voutn in response to at least one second selection signal SEL2. In some embodiments, the second selection circuit 172 may implemented by a MUX. The at least one first selection signal SEL1 and the at least one second selection signal SEL2 may be output from the state machine 45.

A timing signal (CTM) selected by the first selection circuit 170 may be applied to a gate of the buffer 174 and a voltage selected by the second selection circuit 172 may be applied to an operating voltage supply line CVL of the buffer 174. The buffer 174 may be implemented by an inverter. As a result, the first level/timing adjuster 161 may generate the parameter control signal WL for adjusting at least one between the DC level and the AC timing of a parameter. In other words, each of the level/timing adjusters 161 through 164 may generate the parameter control signal WL, DIS, REN, nPRG, LCH, Vref, Rcell, C_S/R, and/or WDE for controlling at least one between the DC level and the AC timing of a different parameter.

Reference is now made to FIG. 10, which is a circuit diagram of the write/read buffer block 66 illustrated in FIG. 2. For clarity of the description, FIG. 10 illustrates a unit write/read buffer connected to a single bitline BL. Some embodiments, however, provide that the write/read buffer block 66 may include a plurality of unit write/read buffers connected to a plurality of bitlines, respectively.

The parameter control signals DIS/Vpp, REN, nPRG, LCH, Vref, Rcell, C_S/R, and WDE generated by the level/timing adjustment block 55 may be applied to the unit write/read buffer, which performs the program, write, read and/or erase operation.

The unit write/read buffer may include a write buffer 180, a read buffer 190, and a data input/output (I/O) circuit 200. In response to each of the parameter control signals Vpp, S/R, WEN, and WDE, illustrated in FIG. 2, 10, or 13, in the program, write and/or erase operation, the write buffer 180 may change and/or adjust the DC level and the AC timing (e.g., an erase time T_RESET or a program time T_SET) of a parameter (e.g., an erase voltage VRESET, an erase current I_RESET, a program voltage VSET, and/or a program current I_SET) used in the program, write, and/or erase operation.

In response to each of the parameter control signals DIS, REN, nPRG, LCH, Vref, and Rcell, illustrated in FIGS. 2, 10, and/or 12, in the read operation, the read buffer 190 may change the DC level and the AC timing (e.g., a development time T_RDEV) of a parameter (e.g., a read voltage Vread or a read current Iread) used in the read operation.

The data I/O circuit 200 may latch I/O data Din/Dout in each operation. Some embodiments provide that the write buffer 180 includes a MOSFET 181, which may control the DC level of a parameter (e.g., the program or write current I_SET) in response to a parameter control signal (e.g., the reset/reset signal S/R) generated by a plurality of transistors in response to the parameter control signal C_S/R. Some embodiments provide that the write buffer 180 includes a MOSFET 183, which is turned on or off in response to a data signal A output from a latch circuit 210, and a MOSFET 185, which provides data corresponding to the data signal A to the bitline BL in response to a parameter control signal (e.g., the write enable signal WEN.) The program or write voltage VSET may be directly applied to one end of the MOSFET 185. A circuit for generating the parameter control signal, (e.g., the set/reset signal S/R) may be implemented within the level/timing adjustment block 55.

In some embodiments, the read buffer 190 includes a plurality of transistors 191, 193, 195, and 197 and a sense amplifier (S/A) 199. The precharge transistor 191 may be turned on or off in response to a parameter control signal (e.g., the bitline precharge signal nPRG.) The precharge transistor 191 may be turned on or off in response to the bitline precharge signal nPRG, whose DC level and/or AC timing has been adjusted.

The discharge transistor 193 may be turned on or off in response to a parameter control signal (e.g., the discharge signal DIS) or may be turned on or off in response to the discharge signal DIS whose DC level and/or AC timing has been adjusted.

The reference transistor 195 may be turned on or off in response to a parameter control signal (e.g., the reference read voltage signal Rcell) or may be turned on or off in response to the reference read voltage signal Rcell, whose DC level and/or AC timing has been adjusted. The reference transistor 195 may generate a reference read current in response to the reference read voltage signal Rcell.

The read enable transistor 197 may be turned on or off in response to a parameter control signal (e.g., the read enable signal REN) or may be turned on or off in response to the read enable signal REN, whose DC level and/or AC timing has been adjusted. In the read operation, the S/A 199 may compare a reference signal Vref with a signal (e.g., the read voltage Vread) of the bitline BL input through the read enable transistor 197 and transmit a read data signal B to the data I/O circuit 200. At least one of the DC level and the AC timing of the reference signal Vref may have been changed or adjusted by the level/timing adjustment block 55. Also, at least one of the DC level and the AC timing of a high voltage Vpp applied to a source of the transistor 181 of the write buffer 180 may have been changed or adjusted by the level/timing adjustment block 55.

The data I/O circuit 200 may latch the data signal B output from the S/A 199 in response to a parameter control signal (e.g., the latch enable signal LCH) and output the latched data signal B as the output data Dout. In the program, write and/or erase operation, the data I/O circuit 200 may transmit the input data Din as a write data signal to the bitline BL through the transistors 183 and 185 in response to a parameter control signal, e.g., the write data enable signal WDE.

Figure 11:
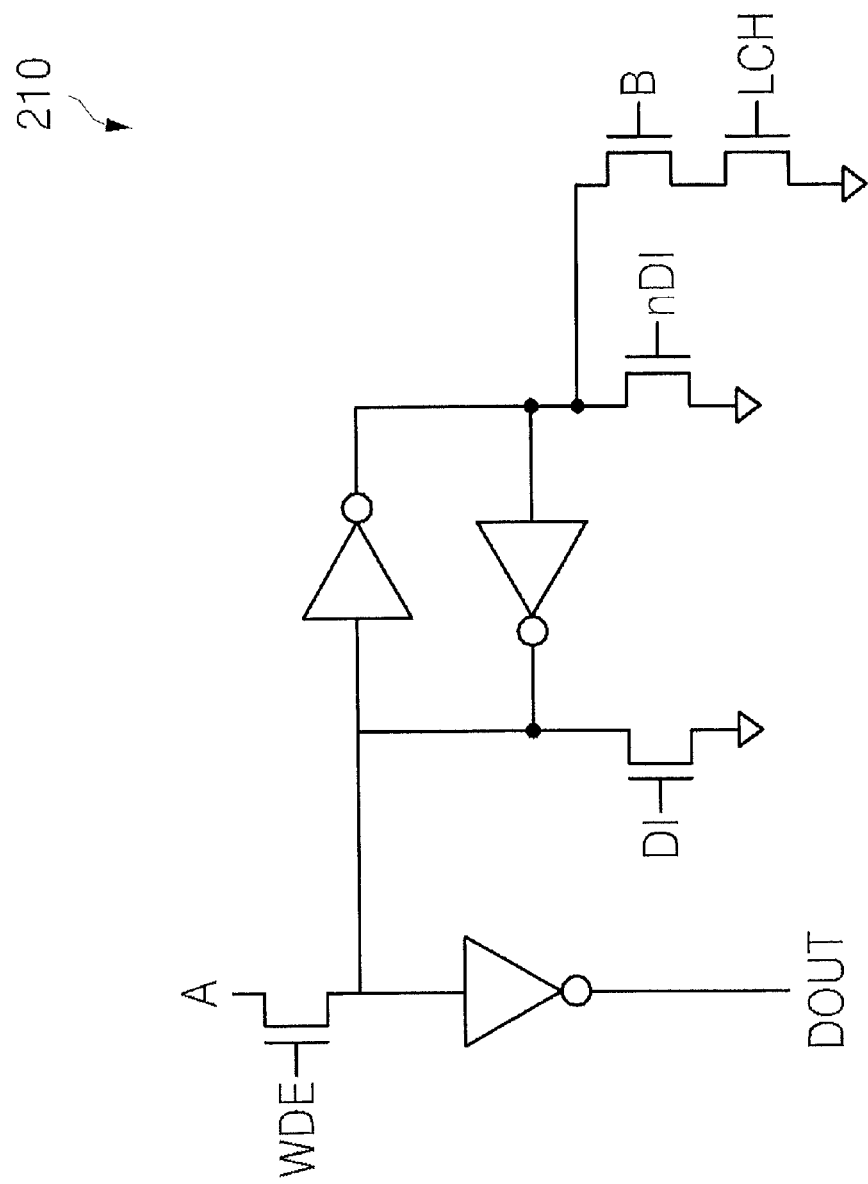
FIG. 11 is a circuit diagram of a latch circuit illustrated in FIG. 10.

Reference is now made to FIG. 11, which is a circuit diagram of the latch circuit 210 illustrated in FIG. 10. Some embodiments provide that the latch circuit 210 includes a plurality of switching transistors and a plurality of inverters. In the program, write and/or erase operation, the latch circuit 210 may write a data signal DI input through an input transistor to a memory cell through the bitline BL in response to the write data enable signal WDE. In the read operation, the latch circuit 210 may output the data signal B from the S/A 199 as the output data Dout in response to the latch signal LCH.

Reference is now made to FIG. 12, which is a timing chart of the read operation of the semiconductor device 30 illustrated in FIG. 2. Referring to FIGS. 1 through 12, when at least one of the DC level and the AC timing of each of the parameter control signals DIS, REN, nPRG, WL, LCH, Vref, and Rcell related with the read operation is changed, a phase, e.g., a bitline discharge time, a bitline precharge time, a development time, a sensing time, and/or a latch time, may be changed.

Referring to FIG. 12, the semiconductor device 30 may control the development time T_RDEV by adjusting the timing of the parameter control signal nPRG. The semiconductor device 30 may also control the read voltage Vread or the read current Iread generated by the transistor 197 by adjusting the DC level of the parameter control signal REN. In addition, the semiconductor device 30 may control a reference read current generated by the reference transistor 195 by adjusting the DC level of the parameter control signal Rcell.

Reference is now made to FIG. 13, which is a timing chart of the write operation of the semiconductor device 30 illustrated in FIG. 2. Referring to FIGS. 1 through 11 and FIG. 13, when at least one between the DC level and the AC timing of each of the parameter control signals REN, WL, S/R, WDE, and WEN related with the program, write, and erase operations is changed, a phase, e.g., a latch/reset time, an erase time, a data loading time, a program time, and/or a recovery time, may be changed.

For instance, the semiconductor device 30 may control the erase voltage VRESET or the erase current I_RESET by adjusting the DC level of the parameter control signal S/R in the erase operation. The semiconductor device 30 may also control the program voltage VSET or the program current I_SET by adjusting the DC level of the parameter control signal S/R in the program operation.

Figure 15:
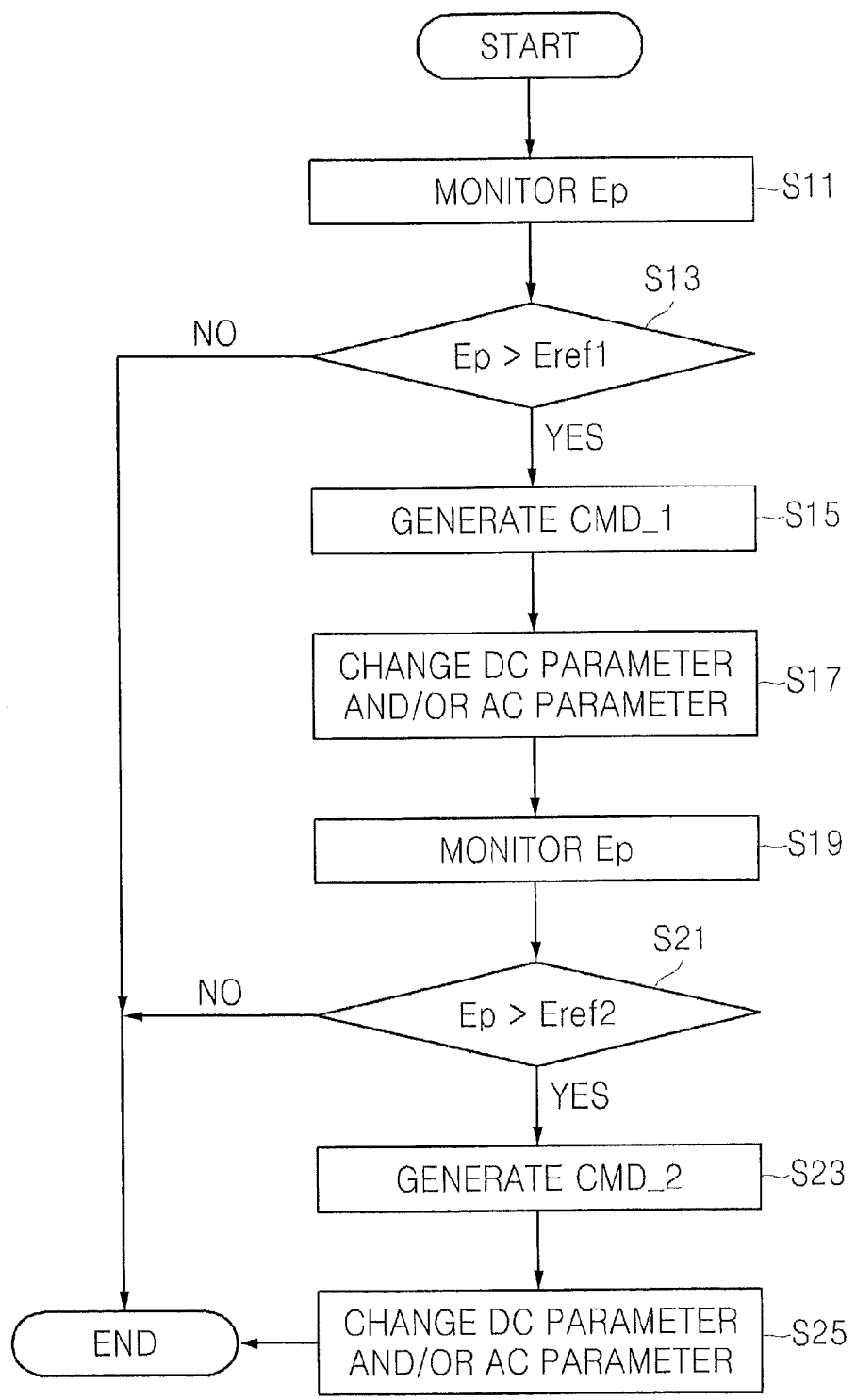
FIG. 15 is a flowchart of the operations of a semiconductor system according to other embodiments of the present invention.

FIG. 15 is a flowchart of the operations of the semiconductor system 10 according to some embodiments of the present invention. Referring to FIGS. 1 through 13 and FIG. 15, the controller 20 monitors a current endurance Ep of the semiconductor device 30 (block 11). The controller 20 compares the current endurance Ep with a first reference endurance Eref1 (block 13). When the current endurance Ep does not exceed the first reference endurance Eref1, the operations end.

However, when the current endurance Ep exceeds the first reference endurance Eref1, the controller 20 generates a first data set CMD_1 for changing at least one between the DC characteristic and the AC timing characteristic of a particular parameter to be changed, as described with reference to FIGS. 1 through 12, and transmits the first data set CMD_1 to the semiconductor device 30 (block 15).

The semiconductor device 30 generates a parameter control signal for changing at least one of the DC level of the particular parameter (or a DC parameter) and the AC timing of the particular parameter (or an AC parameter) according to a command and data included in the first data set CMD_1 and performs an access operation according to the DC level and/or the AC timing changed in response to the parameter control signal (block 17).

After the parameter of the semiconductor device 30 is changed according to the first data set CMD_1, the controller 20 monitors the current endurance Ep of the semiconductor device 30 (block 19). The controller 20 compares the current endurance Ep with a second reference endurance Eref2 (block 21). The operations end when the current endurance Ep does not exceed the second reference endurance Eref2. However, when the current endurance Ep exceeds the second reference endurance Eref2, the controller 20 generates a second data set CMD_2 for changing at least one between the DC characteristic and the AC timing characteristic of the particular parameter, as described with reference to FIGS. 1 through 12, and transmits the second data set CMD_2 to the semiconductor device 30 (block 23).

The semiconductor device 30 generates a parameter control signal for changing at least one between the DC level of the particular parameter (or the DC parameter) and the AC timing of the particular parameter (or the AC parameter) according to a command and data included in the second data set CMD_2 and performs an access operation according to the DC level and/or the AC timing newly changed in response to the parameter control signal (block 25).

The semiconductor system 10 may repeatedly perform operations corresponding to blocks 19-25 as illustrated in FIG. 15 while increasing a reference endurance. Accordingly, the semiconductor system 10 may repeatedly change at least one of the DC characteristic and the AC timing characteristic of the particular parameter.

Figure 16:
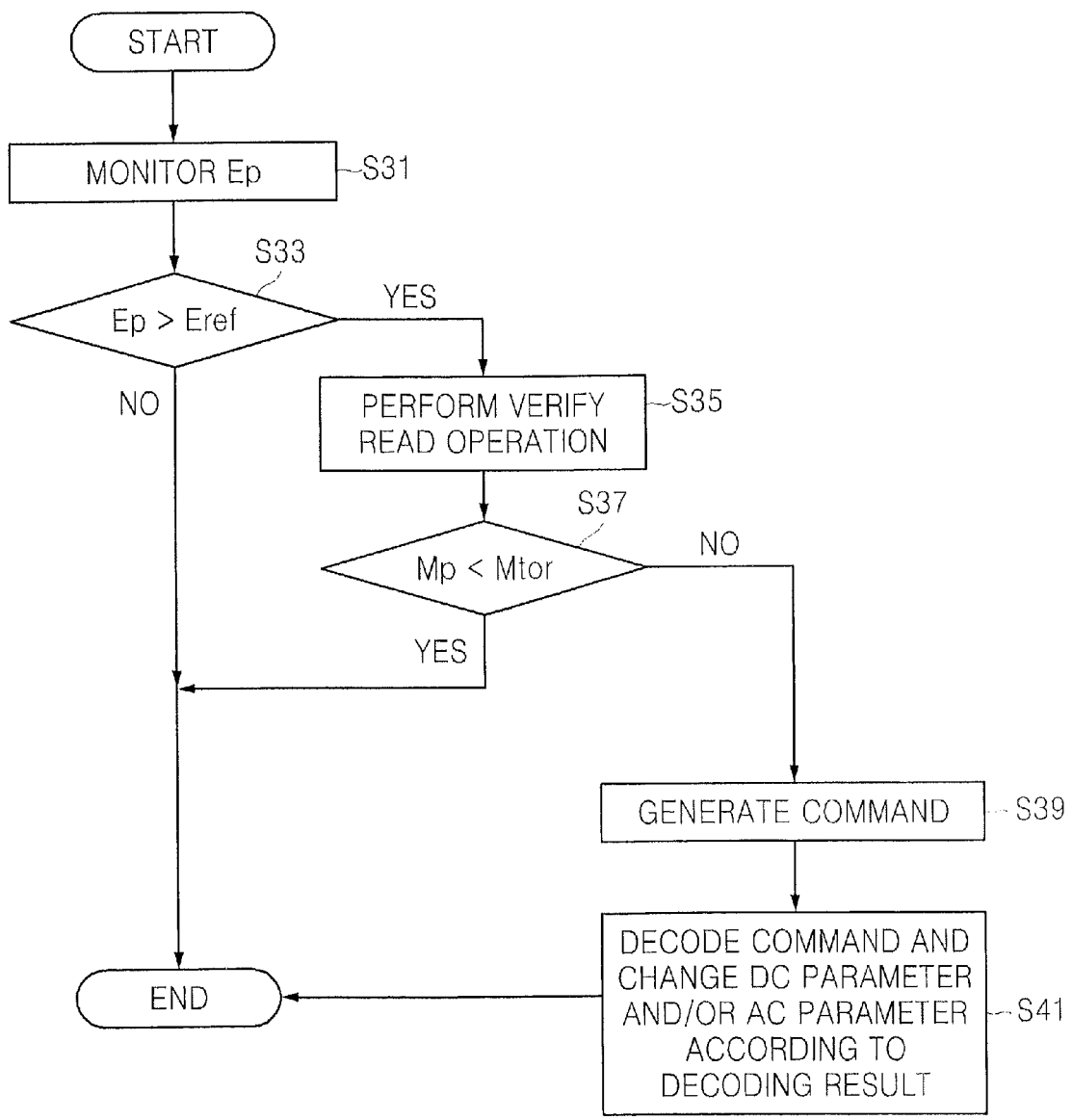
FIG. 16 is a flowchart of the operations of a semiconductor system according to further embodiments of the present invention.

Reference is now made to FIG. 16, which is a flowchart of the operations of the semiconductor system 10 according to some embodiments of the present invention. Referring to FIGS. 1 through 12 and FIG. 16, the controller 20 monitors a current endurance Ep of the semiconductor device 30 (block 31). The controller 20 compares the current endurance Ep with a reference endurance Eref (block 33). When the current endurance Ep does not exceeds the reference endurance Eref, the operations end.

However, when the current endurance Ep exceeds the reference endurance Eref, the controller 20 performs a verify read operation on non-volatile memory cells included in the memory core 60 at least one time (block 35). The controller 20 checks whether a distribution Mp of the non-volatile memory cells subjected to the verify read operation is within a range of a marginal distribution Mtor defined in the specification of the semiconductor device 30 based on the result of the verify read operation (block 37).

When the distribution Mp is less than the marginal distribution Mtor, the controller 20 finishes the operation. However, when the distribution Mp is greater than the marginal distribution Mtor, the controller 20 generates a data set for changing at least one between the DC characteristic and the AC timing characteristic of a particular parameter to be changed, as described with reference to FIGS. 1 through 12, and transmits the data set to the semiconductor device 30 (block 39).

Thereafter, the semiconductor device 30 stores data set in the register 43 indicated by an address according to a command included in the data set and changes at least one between the DC characteristic of the particular parameter (i.e., the DC parameter) and the AC timing characteristic of the particular parameter (i.e., the AC parameter) according to the data set stored in the register 43 (block 41).

According to some embodiments of the present invention, the controller 20 may generate at least one data set for changing at least one parameter (e.g., a program time, an erase time, a read time, a program voltage, an erase voltage, a read voltage, a reference cell voltage, a program current, an erase current, a read current, and/or a reference cell current) affecting endurance and/or retention and transmit the data set to the semiconductor device 30. Accordingly, when fail data occurs during operation, the controller 20 recovers the fail data using at least one changed parameter and controls at least one parameter or at least one changed parameter according to the endurance and/or the retention, thereby increasing the reliability of the semiconductor device 30.

According to some embodiments of the present invention, the semiconductor device 30 may change at least one of the DC characteristic (e.g., the program voltage, the erase voltage, the read voltage, the reference cell voltage, the program current, the erase current, the read current, and/or the reference cell current) and the AC timing characteristic (e.g., the program time, the erase time, and/or the read time) of a parameter requested to be changed by the controller 20 according to a data set output from the controller 20.

In the above-described embodiments of the present invention, changing a parameter may not mean to change the parameter itself but may mean to change the DC characteristic and/or the AC timing characteristic of the parameter. In addition, changing the parameter may mean to change the DC characteristic and/or the AC timing characteristic of a parameter control signal.

As described above, according to some embodiments of the present invention, a semiconductor device can change the DC characteristic and/or the AC timing characteristic of a parameter according to externally input data. Accordingly, when fail data occurs, the semiconductor device can recover the fail data according to the externally input data, thereby increasing data reliability.

While the present invention has been particularly shown and described with reference to exemplary embodiments thereof, it will be understood by those of ordinary skill in the art that various changes in forms and details may be made therein without departing from the spirit and scope of the present invention as defined by the following claims.

What is claimed is:

1. A method of changing a parameter in a semiconductor device, the method comprising:
receiving and storing data in a storage region; and
changing an AC timing characteristic of a parameter, used to access a non-volatile memory cell included in a memory core of the semiconductor device, according to the data stored in the storage region,
wherein the changing the AC timing characteristic of the parameter comprises:
generating a plurality of DC voltages according to a first portion of the data stored in the storage region;
generating a plurality of AC timing signals according to a second portion of the data stored in the storage region;
generating a parameter control signal by mixing one of the DC voltages and one of the AC timing signals in response to selection signals;
changing the AC timing characteristic of the parameter in response to the parameter control signal; and
accessing the non-volatile memory cell according to a changed parameter.

2. The method of claim 1, wherein the parameter is a program time, an erase time, a read time, a program voltage, an erase voltage, a read voltage, a reference cell voltage, a program current, an erase current, a read current, and/or a reference cell current.

3. The method of claim 1, wherein the AC timing characteristic is a parameter control signal time value.

4. A semiconductor device comprising:
a memory core including a plurality of non-volatile memory cells;
an access block configured to access the non-volatile memory cells; and
a control block configured to change, responsive to externally input data, at least one of a DC level and an AC timing characteristic of a parameter control signal that is provided to the access block to change an AC timing characteristic of a parameter used to access the non-volatile memory cells,
wherein the control block comprises:
a voltage generation block configured to generate a plurality of DC voltages according to a first portion of the data;
a timing generation block configured to generate a plurality of AC timing signals according to a second portion of the data; and
a level/timing adjustment block configured to generate the parameter control signal by mixing one of the DC voltages and one of the AC timing signals in response to selection signals.

5. The semiconductor device of claim 4, wherein, when the access block comprises a wordline driver block that drives wordlines connected with the non-volatile memory cells, the control block provides the parameter control signal to the wordline driver block.

6. The semiconductor device of claim 4, wherein, when the access block comprises a program block that programs data to the non-volatile memory cells, the control block provides the parameter control signal to the program block in a program operation to change the AC timing characteristic of the parameter that defines a program time, a program voltage, or a program current.

7. The semiconductor device of claim 4, wherein, when the access block comprises a read block that reads data from the non-volatile memory cells, the control block provides the parameter control signal to the read block in a read operation to change the AC timing characteristic of the parameter that defines a development time, a read voltage, or a read current.

8. The semiconductor device of claim 4, wherein, when the access block comprises an erase block that erases the non-volatile memory cells, the control block provides the parameter control signal to the erase block in an erase operation to change the AC timing characteristic of the parameter that defines an erase time, an erase voltage, or an erase current.

9. The semiconductor device of claim 4, wherein, when the access block comprises a reference memory cell, the control block provides the parameter control signal to the reference memory cell to change the AC timing characteristic of the parameter that defines a reference cell current or a reference cell voltage.

10. A semiconductor system comprising:
a semiconductor device including a memory core that includes a plurality of non-volatile memory cells; and
a controller configured to control an operation of the semiconductor device,
wherein the controller is configured to monitor a characteristic of the non-volatile memory cells, to generate a data set based on a monitoring result, and to transmit the data set to the semiconductor device, and
wherein the semiconductor device further comprises:
a storage region configured to store data included in the data set;
an access block configured to access the non-volatile memory cells; and
a control block configured to change at least one between a DC level and an AC timing characteristic of a parameter control signal provided to the access block to change an AC timing characteristic of a parameter used to access the non-volatile memory cells according to the data stored in the storage region,
wherein the control block comprises:
a voltage generation block configured to generate a plurality of DC voltages according to a first portion of the data;
a timing generation block configured to generate a plurality of AC timing signals according to a second portion of the data; and
a level/timing adjustment block configured to generate the parameter control signal by mixing one of the DC voltages and one of the AC timing signals in response to selection signals.

11. The semiconductor system of claim 10, wherein the characteristic of the non-volatile memory cells comprises at least one of endurance and retention of the non-volatile memory cells.

12. The semiconductor system of claim 10, wherein the controller generates the data set based on a result of comparing a monitored endurance with a reference endurance.

13. The semiconductor system of claim 10, wherein the controller generates the data set based on a result of comparing a monitored endurance with a reference endurance and based on a marginal distribution.

14. The semiconductor system of claim 10, wherein the controller informs a user of the monitoring result through an interface logic unit and generates the data set according to a parameter change signal input by the user through the interface logic unit.

15. The semiconductor system of claim 10, wherein the parameter is a program time, an erase time, a read time, a program voltage, an erase voltage, a read voltage, a reference cell voltage, a program current, an erase current, a read current, and/or a reference cell current.

16. The semiconductor system of claim 10, wherein the AC timing characteristic is a time.

* * * * *